US006614365B2

(12) United States Patent
Suzuki et al.

(10) Patent No.: US 6,614,365 B2
(45) Date of Patent: Sep. 2, 2003

(54) CODING DEVICE AND METHOD, DECODING DEVICE AND METHOD, AND RECORDING MEDIUM

(75) Inventors: Shiro Suzuki, Kanagawa (JP); Minoru Tsuji, Chiba (JP); Keisuke Toyama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/020,829

(22) Filed: Dec. 12, 2001

(65) Prior Publication Data

US 2002/0154041 A1 Oct. 24, 2002

(30) Foreign Application Priority Data

Dec. 14, 2000 (JP) .................................... P2000-380642

(51) Int. Cl.[7] ................................................ H03M 7/00
(52) U.S. Cl. ........................................... 341/50; 341/67
(58) Field of Search ...................... 341/50, 67; 704/220

(56) References Cited

U.S. PATENT DOCUMENTS 6,240,386 B1 * 5/2001 Thyssen et al. ............. 704/220
6,356,211 B1 * 3/2002 Shimoyoshi et al. ......... 341/50

* cited by examiner

*Primary Examiner*—Peguy Jeanpierre
*Assistant Examiner*—Joseph Lauture
(74) *Attorney, Agent, or Firm*—Sonnenschein, Nath & Rosenthal

(57) ABSTRACT

Coding is made possible with higher efficiency while the listener is prevented from feeling a sense of incongruity. An adaptive mixing section performs a mixing process on input signals on the basis of distortion factor information supplied from a distortion factor detection section, and controls the operation time of MS stereo coding or IS stereo coding. Furthermore, the adaptive mixing section creates power correction information in accordance with a mixing coefficient, and causes power correction to be performed during reproduction. A coding control section selects a coding method of a coding process performed in a coding section and supplies it to the coding section. The coding section selects dual coding, MS stereo coding, or IS stereo coding in accordance with the instructions from the coding control section, and codes a spectrum signal supplied from a domain conversion section.

14 Claims, 21 Drawing Sheets

FIG. 10

| En(f) (%) | a | b | |
|---|---|---|---|
| 0 | 1.00 | 0.00 | ← COMPLETELY STEREO |
| 10 | 0.95 | 0.05 | |
| 20 | 0.90 | 0.10 | |
| 30 | 0.85 | 0.15 | |
| 40 | 0.80 | 0.20 | |
| 50 | 0.75 | 0.25 | |
| 60 | 0.70 | 0.30 | |
| 70 | 0.65 | 0.35 | |
| 80 | 0.60 | 0.40 | |
| 90 | 0.55 | 0.45 | |
| 100 | 0.50 | 0.50 | ← COMPLETELY MONAURAL |

FIG. 11

| $P_{ln}$ / $P_{rn}$ | $E_n(f)$ (%) | a / b | $P_{lnmix}$ / $P_{rnmix}$ | $P_{n,\ adj}(t)$ (c/d) |
|---|---|---|---|---|
| 1.0 / 1.0 | 0 | 1.00 / 0.00 | 1.0 / 1.0 | 1.00 / 1.00 |
| 5.0 / 1.0 | 0 | 1.00 / 0.00 | 5.0 / 1.0 | 1.00 / 1.00 |
| 5.0 / 1.0 | 50 | 0.75 / 0.25 | 4.0 / 2.0 | 1.25 / 0.50 |
| 5.0 / 1.0 | 100 | 0.50 / 0.50 | 3.0 / 3.0 | 1.67 / 0.33 |
| 1.0 / 5.0 | 0 | 1.00 / 0.00 | 1.0 / 5.0 | 1.00 / 1.00 |
| 1.0 / 5.0 | 50 | 0.75 / 0.25 | 2.0 / 4.0 | 0.50 / 1.25 |
| 1.0 / 5.0 | 100 | 0.50 / 0.50 | 3.0 / 3.0 | 0.33 / 1.67 |

CODING DEVICE AND METHOD, DECODING DEVICE AND METHOD, AND RECORDING MEDIUM

RELATED APPLICATION DATA

The present application claims priority to Japanese Application(s) No(s). P2000-380642 filed Dec. 14, 2000, which application(s) is/are incorporated herein by reference to the extent permitted by law.

BACKGROUND OF THE INVENTION

1. Field of the Invention

The present invention relates to a coding device and method, a decoding device and method, and a recording medium therefor. More particularly, the present invention relates to a coding device and method and a decoding device and method, which are capable of coding or decoding an audio signal at a low bit rate, and a recording medium therefor.

2. Description of the Related Art

In recent years, a so-called "perception audio coder (decoder)" has been developed. In a conventional CD-ROM (Compact Disk-Read Only Memory), transmission and storage of high-quality audio signals are possible at a bit rate which is approximately one twelfth the bit rate in common use.

Such a coder codes an audio signal by using a waveform portion, which is contained in the audio signal, which cannot be listened to due to the limitation of the auditory system of human beings. With regard to a stereo audio signal, for example, a coder using MS stereo coding (intermediate-portion/side-portion stereo coding) and a coder using IS stereo coding (intensity stereo coding) are known.

FIG. 1 is a block diagram showing an example of the construction of a conventional audio signal transmission system using MS stereo coding.

A left signal L and a right signal R which form a stereo audio signal is input to a computation section 1. These signals are added by an adder 1-1, and the resulting signal is output to a multiplier 1-2. Meanwhile, a difference signal of those signals is generated in a subtracter 1-3, and the resulting signal is output to a multiplier 1-4. In the multipliers 1-2 and 1-4, the outputs of the adder 1-1 and the subtracter 1-3 are multiplied by a coefficient x, and a sum signal M and a difference signal S are generated. These signals are coded by a coding section 2, and are output to recording media or a transmission line 3 formed of a network, etc.

A decoding section 4 performs a decoding process on an input code sequence in order to generate a sum signal M' and a difference signal S'. The sum signal M' and the difference signal S' are added by an adder 5-1, and are multiplied by a coefficient y in a multiplier 5-2, and the resulting signal is output as a left signal L'. Also, the sum signal M' and the difference signal S' are subtracted by a subtracter 5-3, and the resulting signal is multiplied by a coefficient y in a multiplier 5-4 and is output as a right signal R'. For example, the coefficient x is set to 0.5, and the coefficient y is set to 1.0.

A sum signal exerts more influence on the sense of hearing of a human being than a difference signal. In the manner described above, by generating a sum signal M and a difference signal S and by assigning a larger amount of data (the number of bits) to the sum signal M, coding can be performed with higher efficiency than when the signals are coded (dual decoding) individually. MS stereo coding is effective for signals of lower frequency bands.

FIG. 2 is a block diagram showing an example of the construction of a conventional audio signal transmission system using IS stereo coding.

The left signal L and the right signal R which are input to a computation section 11, are added by an adder 11-1, and an intensity signal I determined by a correlation of those signals is generated. Also, a left power signal P1 (a scaling signal in which the energy content is described) indicating the power of the left signal L and a right power signal Pr (a scaling signal in which the contents of energy are described) indicating the power of the right signal R are generated in the computation section 11. The intensity signal I, the left power signal Pl, and the right power signal Pr are input to a coding section 12, where the signals are coded, and thereafter, the signals are output to a transmission line 13.

A decoding section 14 decodes the input signals, and outputs the obtained intensity signal I', left power signal Pl', and right power signal Pr' to a computation section 15. In the computation section 15, a multiplier 15-1 regenerates a left signal L' in accordance with the intensity signal I' and the left power signal Pl' and outputs them externally, and a multiplier 15-2 regenerates a right signal R' in accordance with the intensity signal I' and the right power signal Pr' and outputs them externally.

As a result of performing coding by using IS stereo coding, the characteristics such that the position detection performance based on the time difference of the hearing of a human being is lower for a signal in higher-frequency domains can be used. For example, coding can be performed at a data rate approximately one half that in a case where left and right signals are coded independently.

For MS stereo coding and IS stereo coding, equivalent advantages are not obtained with respect to all the input signals. For example, MS stereo coding is an effective means only for the case where the energy of the difference signal S becomes smaller than the energy of the sum signal M. Otherwise, when the left signal L' and the right signal R' are regenerated from the sum signal M' and the difference signal S', quantization noise which occurs due to coding or decoding (quantization/inverse quantization) causes interference, and noise which can be heard clearly in the sense of hearing may be produced.

Furthermore, in IS coding, when the high-frequency components of a stereo signal are synthesized, and there is not a high correlation between a spectrum SPm which is obtained by converting the components from the time domain to the frequency domain and the envelope shapes of the original power spectra Pl and Pr, for example, when the left signal L is a signal of a trumpet and the right signal R is a signal of cymbals, the positional relationship between the respective sound sources (musical instruments) cannot be maintained, and noise which can be heard clearly may occur in the sense of hearing.

Therefore, a coding device has been conceived in which, as shown in FIGS. 3, 4, and 5, dual coding in which left and right signals are each coded independently, and MS or IS stereo coding are combined, and a coding method is selected as appropriate in accordance with an input signal.

FIG. 3 is a block diagram showing an example of the construction of a prior coding device for coding an input signal in the time domain.

A filter bank 31-1 divides an input left signal L(t) into signals $L_n(t)$, $L_{n-1}(t)$, . . . , $L_1(t)$ (n is the number of divided bands) of predetermined frequency bands, and outputs each signal to a corresponding dual coding section 32 and a corresponding MS/IS coding section 33. In FIG. 3, although only the dual coding section 32 and the MS/IS coding section 33 for processing the signal $L_n(t)$ are shown, coding sections corresponding to signals $L_{n-1}(t)$, $L_{n-2}(t)$, . . . , $L_1(t)$ are provided in a similar manner.

Similarly to the filter bank 31-1, a filter bank 31-2 also divides a right signal $R_n(t)$ into signals $R_n(t)$, $R_{n-1}(t)$, . . . , $R_1(t)$ of predetermined frequency bands, and outputs each signal to the corresponding dual coding section 32 and the corresponding MS/IS coding section 33. In the following, when the filter bank 31-1 and the filter bank 31-2 need not be identified individually, these are referred to collectively as a filter bank 31. The same applies to the other devices.

The dual coding section 32 codes an input signal by a dual coding method (the left signal $L_n(t)$ and the right signal $R_n(t)$ are each coded independently), and outputs the obtained data to a switch 35. Furthermore, the dual coding section 32 creates number-of-necessary-bits information $B_n(t)_1$ which is information about the amount of coded data and distortion factor information $E_n(t)_1$ which is information about the distortion factor with respect to a sine wave when coding is performed, and supplies them to a coding control section 34.

The MS/IS coding section 33 codes the input signal by the MS stereo coding method or the IS stereo coding method, and outputs the obtained data to the switch 35. Also, the MS/IS coding section 33 creates number-of-necessary-bits information $B_n(t)_2$ and distortion factor information $E_n(t)_2$, and supplies them to the coding control section 34.

The coding control section 34 switches the contact of the switch 35 so that a code sequence which is coded by a coding method with a small distortion factor or a coding method with a smaller number of necessary bits is selected on the basis of the information supplied from the dual coding section 32 and the MS/IS coding section 33. The code sequence selected by the switch 35 is input to a multiplexer 36.

The multiplexer 36 combines the code sequences $C_n$, $C_{n-1}$, . . . , $C_1$ of each band, divided by the filter bank 31, and outputs the combined code sequence C to a device, such as a transmission line (not shown), external of a coding device 21.

FIG. 4 is a block diagram showing an example of the construction of a prior coding device for coding an input signal.

A domain conversion section 51-1 spectrum-converts the input left signal L(t) into the frequency domain, and outputs the generated spectrum signal $L_n(f)$ to a dual coding section 52 and an MS/IS coding section 53. Similarly to the domain conversion section 51-1, a domain conversion section 51-2 also spectrum-converts the input right signal R(t) into the frequency domain, and outputs the generated spectrum signal $R_n(f)$ to the dual coding section 52 and the MS/IS coding section 53.

The dual coding section 52 codes the input signal by the dual coding method, and outputs the obtained code sequence to a switch 55. Furthermore, the dual coding section 52 creates number-of-necessary-bits information $B_n(f)_1$ which is information about the amount of coded data and distortion factor information $E_n(f)_1$ which is information about the distortion factor with respect to a sine wave when coding is performed, and supplies them to a coding control section 54.

The MS/IS coding section 53 codes the input signal by an MS stereo coding method or an IS stereo coding method, and outputs the obtained data to the switch 55. Furthermore, the MS/IS coding section 53 creates number-of-necessary-bits information $B_n(f)_2$ and distortion factor information $E_n(f)_2$, and supplies them to the coding control section 54.

The coding control section 54 controls the switch 55 so that a code sequence which is coded by a coding method with a smaller distortion factor or a coding method with a smaller number of necessary bits is selected on the basis of the information supplied from the dual coding section 52 and the MS/IS coding section 53.

FIG. 5 is a block diagram showing an example of the construction of a prior coding device in which the coding device 21 of FIG. 3 and the coding device 41 of FIG. 4 are combined.

More specifically, in this example, the left signal L(t) and the right signal R(t) are divided into a predetermined number of bands by filter banks 71-2 and 71-2, and the divided signals are spectrum-converted by domain conversion sections 72-1 and 72-2, respectively. The converted spectrum signals are coded by a dual coding section 73 and an MS/IS coding section 74. In a coding control section 75 and a switch 76, among the code sequences coded in the dual coding section 73 and the MS/IS coding section 74, the code sequence by the coding method with higher efficiency (with a smaller distortion factor or with a smaller amount of data) is selected and is output to a multiplexer 77. Then, after the input data of all the bands is combined by the multiplexer 77, the data is output to outside a coding device 61.

Next, referring to the flowchart in FIG. 6, the process of the coding control section 34 of the coding device 21 of FIG. 3 will be described below. Although descriptions are omitted, the processes of the coding control section 54 of FIG. 4 and the coding control section 75 of FIG. 5 are the same as the above. In this example, it is assumed that the coding control section 34 selects a coding method on the basis of the distortion factor.

In step S1, the coding control section 34 compares the distortion factor information $E_n(t)_1$ supplied from the dual coding section 32 with the distortion factor information $E_n(t)_2$ supplied from the MS/IS coding section 33. Then, the coding control section 34 determines whether or not the distortion factor supplied from the dual coding section 32 is smaller than the distortion factor supplied from the MS/IS coding section 33. When it is determined that the distortion factor is smaller, in step S3, the coding control section 34 controls the switch 35 so that the data coded by the dual coding section 32 is output to the multiplexer 36.

When, on the other hand, it is determined in step S2 that the distortion factor supplied from the dual coding section 32 is greater than the distortion factor supplied from the MS/IS coding section 33, the process proceeds to step S4, where the coding control section 34 controls the switch 35 so that the data coded by the MS/IS coding section 33 is output to the multiplexer 36.

The same process is performed in the other bands. As a result, a code sequence C which is coded for each band by a low-bit-rate coding method is created, and is output to outside the coding device 21.

In the manner described above, the coding efficiencies of the respective coding methods are compared with each other, and an optimum method is selected according to the result thereof, thereby making it possible to obtain coded data at a lower bit rate in comparison with a case in which coding is performed by a single coding method.

FIGS. 7A, 7B, 7C, and 7D show an example of the relationship among the operation time probability $P_{MS}$ of MS stereo coding or the operation time probability $P_{IS}$ of IS stereo coding in the coding devices of FIGS. 3 to 5, the signal power to noise power ratio SNR of the coded (quantized) signal, and the separation of the left and right signals.

As shown in FIG. 7A, the probability $P_{MS}$ or $P_{IS}$ shown in the horizontal axis is proportional to the SNR shown in the vertical axis. The nearer the probability $P_{MS}$ or $P_{IS}$ approaches 100% (monaural), the more the SNR is improved.

FIG. 7B shows the change in the probability $P_{MS}$ or $P_{IS}$ with respect to time. FIG. 7C shows the change in the SNR with respect to time. As shown in these figures, since the waveforms thereof become in same phase, and the coding efficiency is improved by increasing the probability $P_{MS}$ or $P_{IS}$ in accordance with the input signal, the SNR is also improved, and thus the sound quality is improved. For this reason, it is preferable from the viewpoint of coding efficiency that the probability $P_{MS}$ or $P_{IS}$ be higher.

However, high probability $P_{MS}$ indicates that there is a high correlation between the left and right signals. High probability $P_{IS}$ indicates that the intensity signal and the spectrum to be coded are for one channel although the power levels are different. That is, high probability $P_{MS}$ or $P_{IS}$ is indicates that a stereo signal is changed into a monaural signal. As shown in FIG. 7D, the separation of the left and right signals becomes poorer as the probability $P_{MS}/P_{IS}$ is increased.

Furthermore, since the probability $P_{MS}$ or $P_{IS}$ is linked with the SNR, if the value of the probability $P_{MS}$ or $P_{IS}$ is high, there is the risk that, due to a change of the properties of the input signal or due to a change of the input signal with respect to time, the SNR falls below the perceptible noise level limit in an auditory psychological model (a level at which, if the SNR decreases to less than that level, perceptual noise is heard). Therefore, when considered together, the value of the probability $P_{MS}$ or $P_{IS}$ being high is not always preferable.

In the coding devices shown in FIGS. 3 to 5, a determination of whether the efficiency when coding is performed by MS stereo coding or IS stereo coding or the efficiency when coding is performed by dual coding is superior, cannot be known until the two coding processes are actually performed, thus presenting the problem that the amount of processing in each coding section increases.

Also, when MS stereo coding or IS stereo coding is performed, the coding efficiency can be increased (quantized noise can be decreased). However, when it is not performed, such advantages cannot be obtained. Consequently, sound-quality variations with respect to time are large between when MS stereo coding or IS stereo coding is performed or not, and a problem arises in that the listener feels a substantial sense of incongruity in the sense of hearing.

SUMMARY OF THE INVENTION

The present invention is made in view of such circumstances. The present invention aims to code or decode an audio signal at a higher efficiency while the listener is prevented from feeling a sense of incongruity.

To this end, according to one aspect of the present invention, there is provided a coding device for coding an input signal, comprising: coding method selection means for selecting a coding method in accordance with the input signal; coding means for coding the input signal in accordance with the coding method selected by the coding method selection means; distortion factor detection means for detecting a distortion factor of coding by the coding means; and mixing means for mixing the left and right components of the input signal on the basis of a mixing ratio determined in such a manner as to correspond to the distortion factor detected by the distortion factor detection means, wherein the coding method selection means selects the coding method in accordance with the input signal mixed by the mixing means.

The coding device may further comprise output correction information creation means for creating output correction information which is used when the input signal coded by the coding means is decoded.

The coding method selection means may select the coding method for the input signal on the basis of a threshold value determined according to the construction of the coding device.

The coding method selection means may select the coding method from among a dual coding method, an MS stereo coding method, and an IS stereo coding method.

The coding method selection means may select the dual coding method to perform coding on the basis of the correlation between the left and right components of the input signal, that is, the total of the sum signals with respect to the total of the difference signals of the left and right components, and may select MS stereo coding or IS stereo coding to perform coding on the basis of the maximum value of the absolute value of the difference of the left and right components of the input signal.

The mixing means may store the mixing ratio, and may change the mixing ratio on the basis of an interpolation function of the mixing ratio determined immediately before and the mixing ratio determined currently.

The coding device may further comprise input signal storage means for storing the input signal, wherein the mixing means may mix again the left and right components of the same input signal on the basis of the distortion factor used when the input signal is coded.

According to another aspect of the present invention, there is provided a coding method for coding an input signal, comprising: a coding method selection step of selecting a coding method in accordance with the input signal; a coding step of coding the input signal in accordance with the coding method selected in the coding method selection step; a distortion factor detection step of detecting a distortion factor of coding in the coding step; and a mixing step of mixing the left and right components of the input signal on the basis of a mixing ratio determined in such a manner as to correspond to the distortion factor detected in the distortion factor detection step, wherein the process of the coding method selection step selects the coding method in accordance with the input signal mixed in the mixing step.

According to another aspect of the present invention, there is provided a recording medium having recorded thereon a computer-readable program, the program comprising: a coding method selection step of selecting a coding method in accordance with an input signal; a coding step of coding the input signal in accordance with the coding method selected in the coding method selection step; a distortion factor detection step of detecting a distortion factor of coding in the coding step; and a mixing step of mixing the left and right components of the input signal on the basis of a mixing ratio determined in such a manner as to correspond to the distortion factor detected in the distortion factor detection step, wherein the process of the coding method selection step selects the coding method in accordance with the input signal mixed in the mixing step.

According to another aspect of the present invention, there is provided a decoding device for decoding a code sequence coded by a predetermined coding method, the decoding device comprising: decoding method selection means for selecting a decoding method corresponding to the coding method; decoding means for decoding an input code sequence in accordance with the decoding method selected by the decoding method selection means; correction means for correcting the left and right components of a signal decoded by the decoding means on the basis of information supplied from the coding device; and output means for outputting the signal corrected by the correction means.

According to another aspect of the present invention, there is provided a decoding method for decoding a code sequence coded by a predetermined coding method, the decoding method comprising: a decoding method selection step of selecting a decoding method corresponding to a coding method used by a coding device; a decoding step of decoding an input code sequence in accordance with the decoding method selected in the decoding method selection step; a correction step of correcting the left and right components of a signal decoded in the decoding step on the basis of information supplied from the coding device; and an output step of outputting the signal corrected in the correction step.

According to another aspect of the present invention, there is provided a recording medium having recorded thereon a computer-readable program, the program comprising: a decoding method selection step of selecting a decoding method corresponding to a coding method used by a coding device; a decoding step of decoding an input code sequence in accordance with the decoding method selected in the decoding method selection step; a correction step of correcting the left and right components of a signal decoded in the decoding step on the basis of information supplied from the coding device; and an output step of outputting the signal corrected in the correction step.

In the coding device and method and the program of the recording medium of the present invention, a coding method is selected in accordance with an input signal, the input signal is coded on the basis of the selected coding method, and the left and right components of the input signals are mixed. Furthermore, a coding method is selected in accordance with the mixed input signals. Therefore, it is possible to code an audio signal with higher efficiency.

In the decoding device and method and the program of the recording medium of the present invention, a decoding method corresponding to a coding method used by a coding device is selected, and an input code sequence is decoded on the basis of the selected decoding method. Furthermore, the left and right components of the decoded signal are corrected on the basis of the information supplied from the coding device, and the corrected signal is output. Therefore, it is possible to reproduce a coded audio signal with higher efficiency while the listener is prevented from feeling a sense of incongruity.

Further objects, features and advantages of the present invention will become apparent from the following description of the preferred embodiments with reference to the attached drawings.

BRIEF DESCRIPTION OF THE DRAWINGS

FIG. 10 is a table showing an example of information stored in a mixing coefficient setting section of FIG. 9;

FIG. 11 is a table showing an example of information stored in a power correction section of FIG. 9;

DESCRIPTION OF THE PREFERRED EMBODIMENTS

Figure 1:
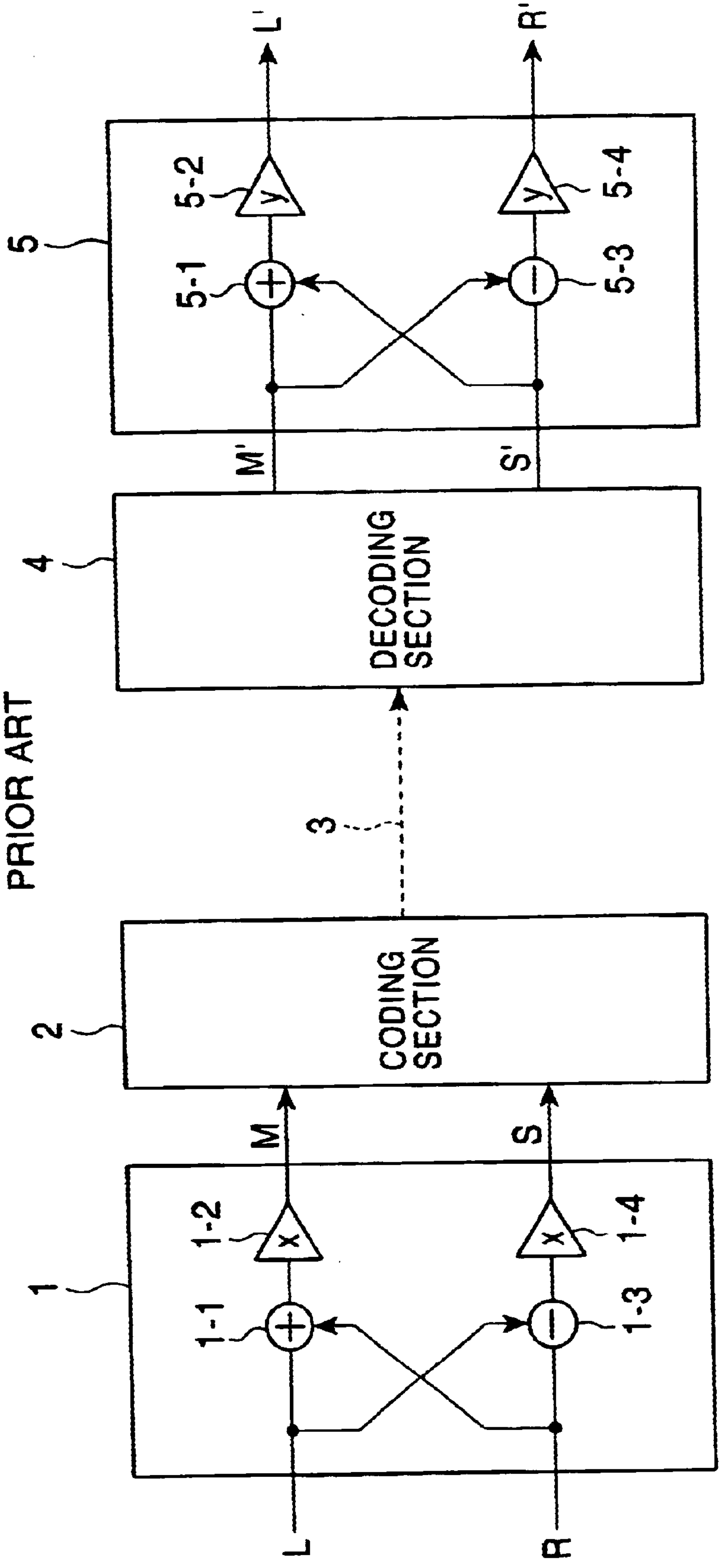
FIG. 1 PRIOR ART
FIG. 1 is a block diagram showing an example of the configuration of a prior audio signal transmission system employing MS stereo coding.
Figure 2:
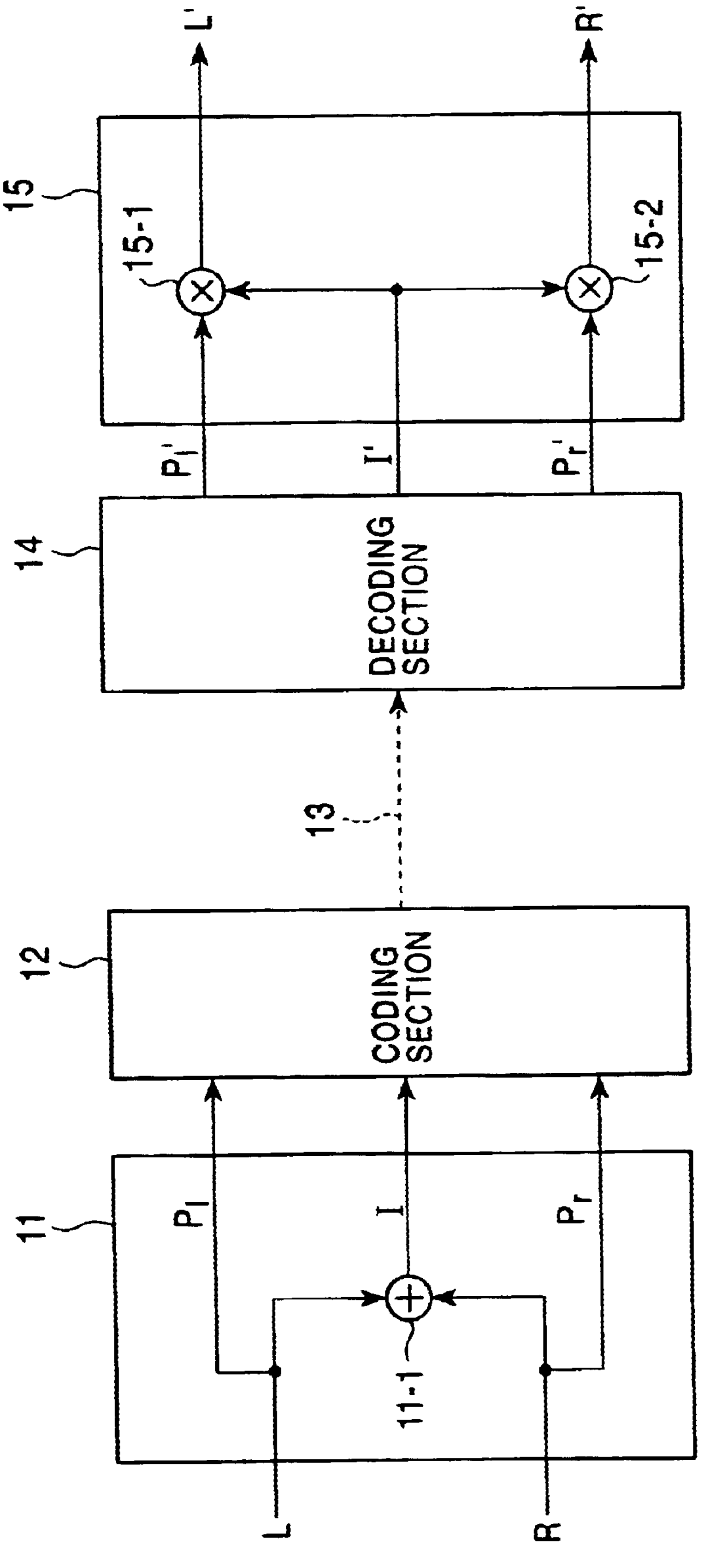
FIG. 2 PRIOR ART
FIG. 2 is a block diagram showing an example of the configuration of a prior audio signal transmission system employing IS stereo coding.
Figure 3:
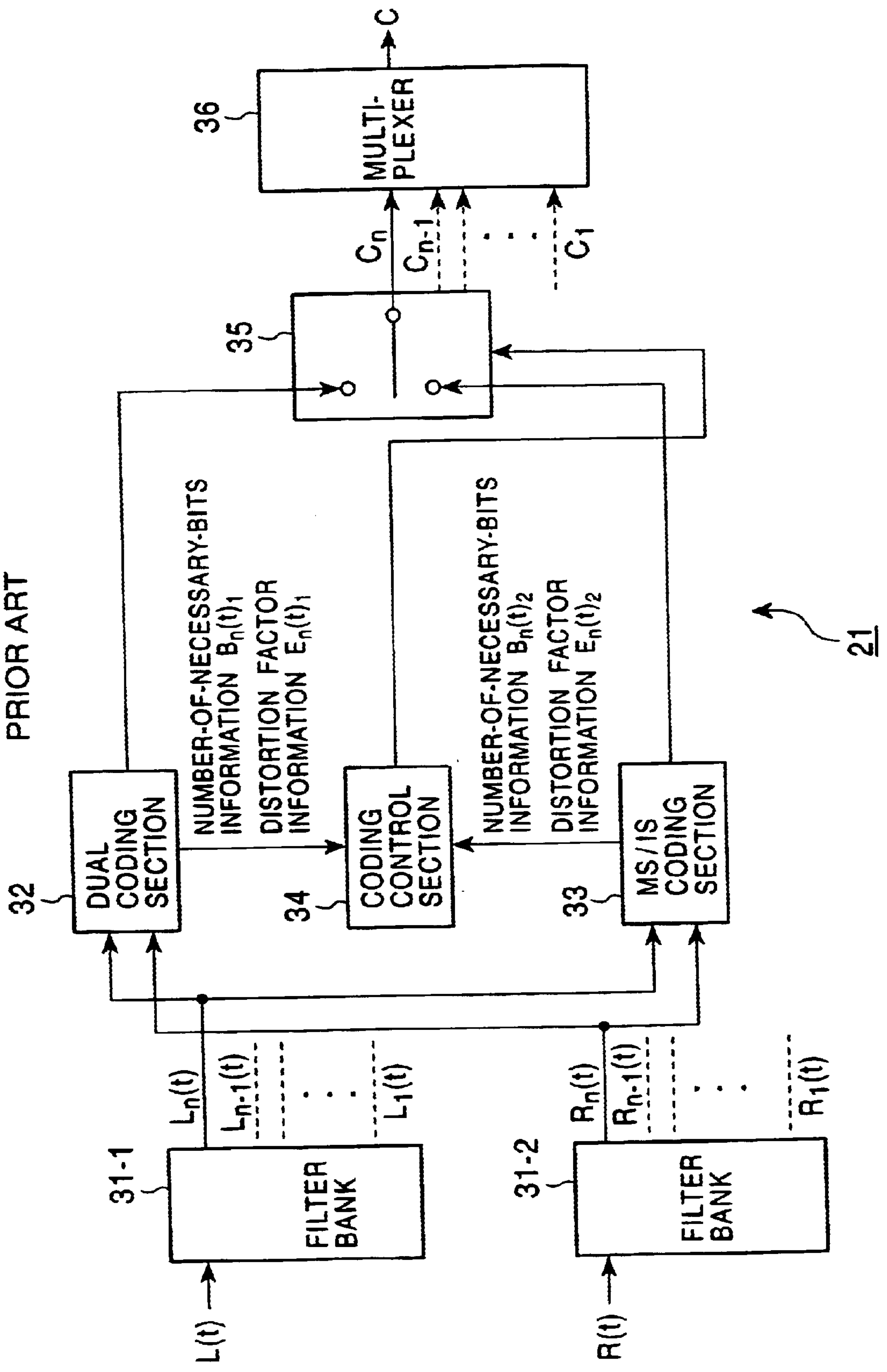
FIG. 3 PRIOR ART
FIG. 3 is a block diagram showing an example of the construction of a prior coding device.
Figure 4:
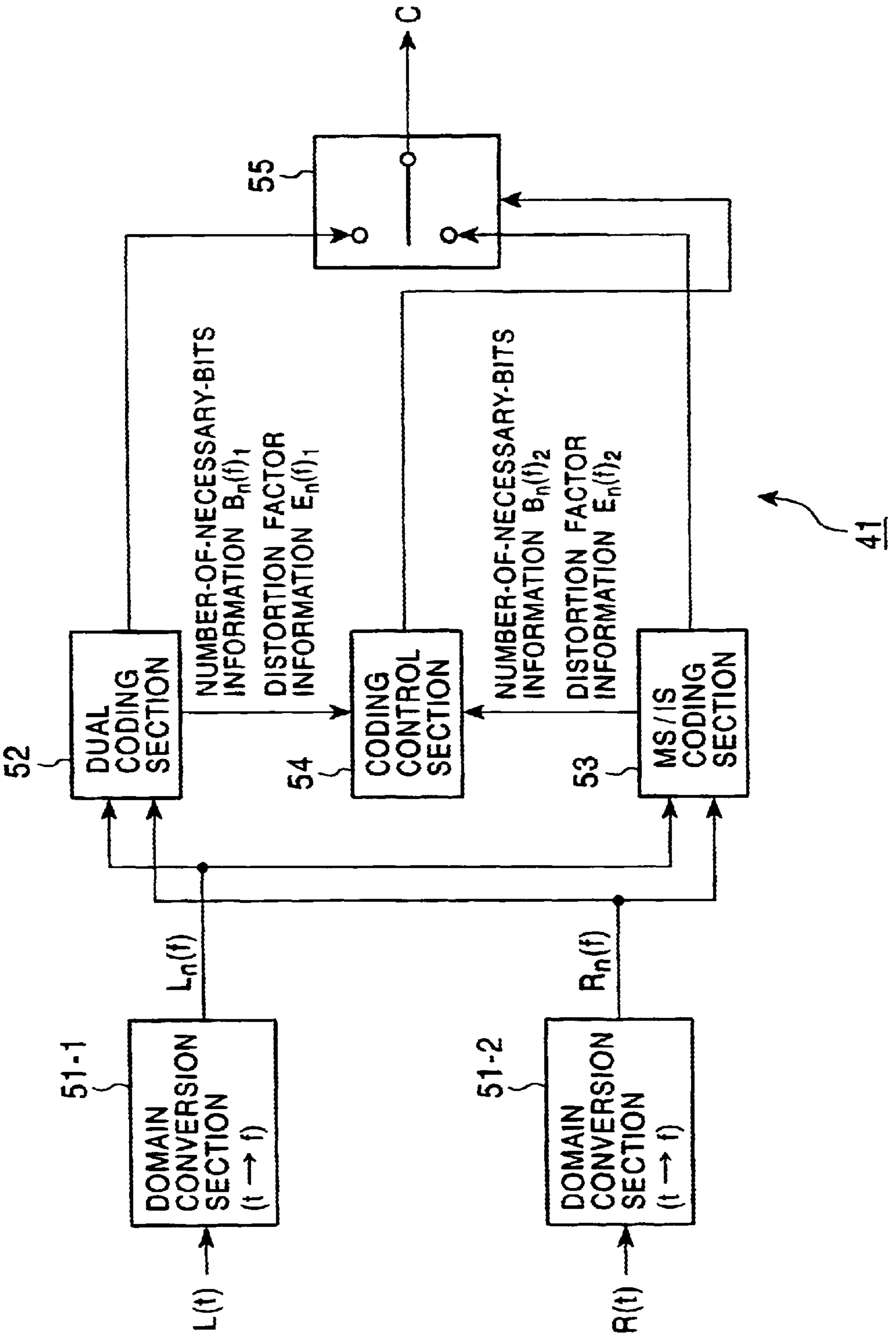
FIG. 4 PRIOR ART
FIG. 4 is a block diagram showing an example of the construction of another prior coding device.
Figure 5:
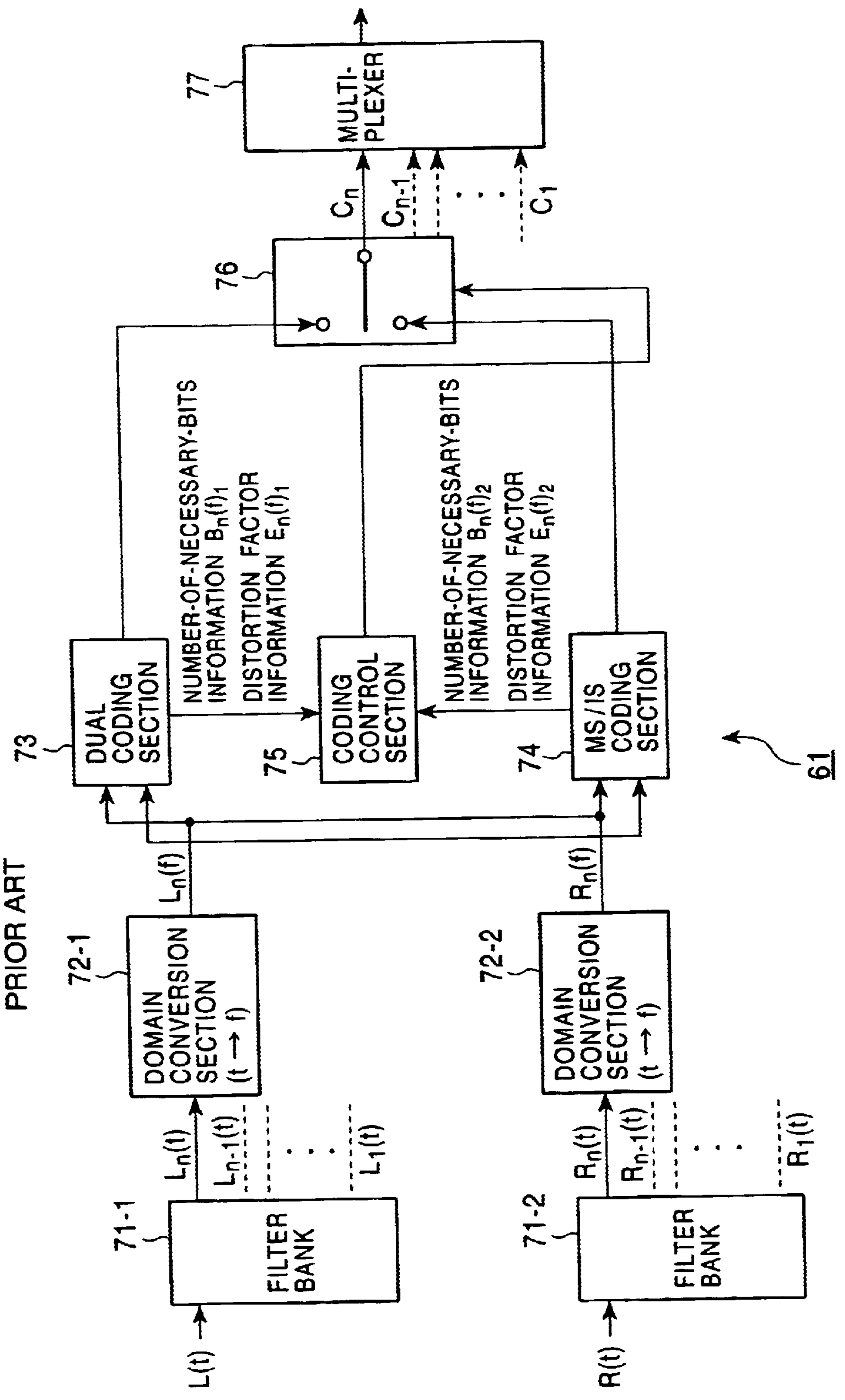
FIG. 5 PRIOR ART
FIG. 5 is a block diagram showing an example of the construction of another prior coding device.
Figure 6:
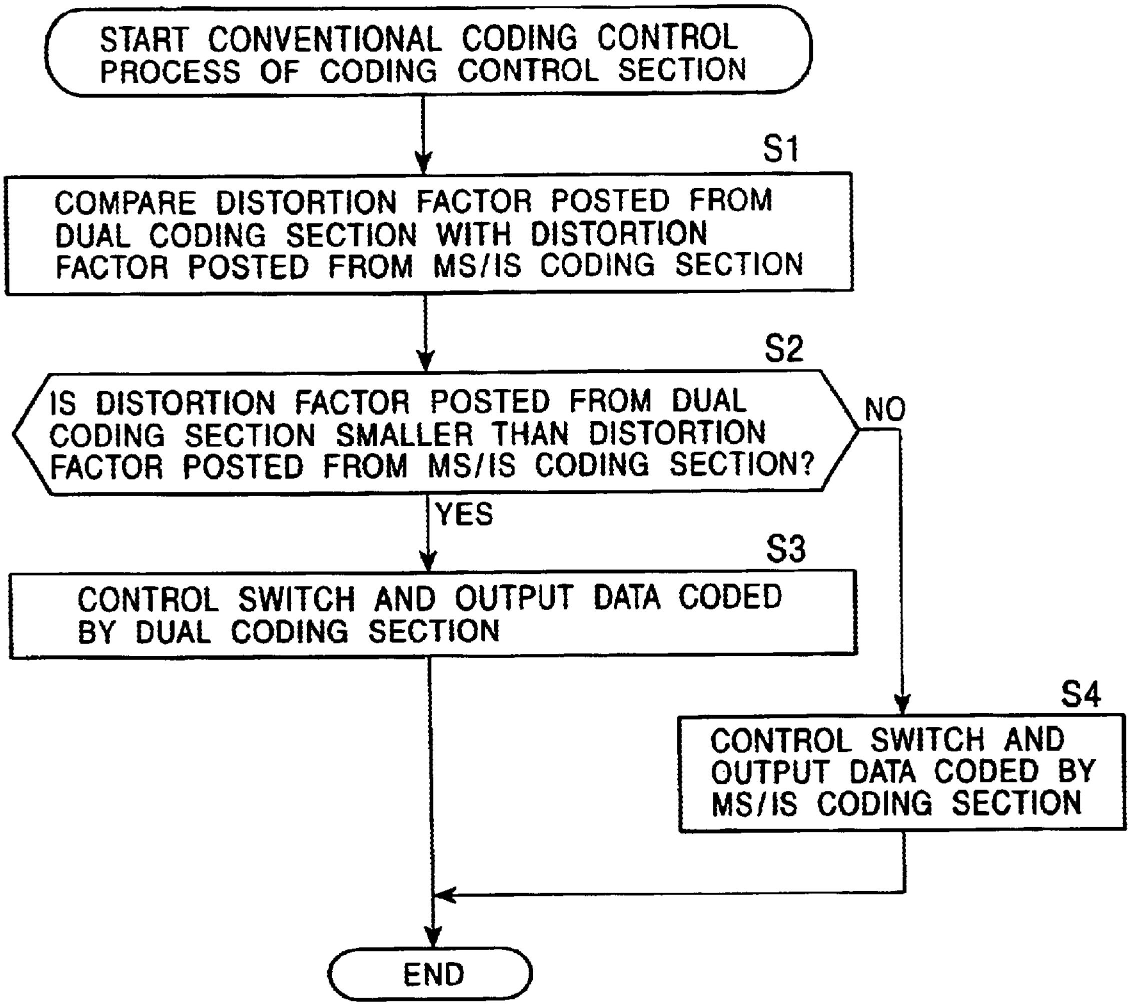
FIG. 6 PRIOR ART
FIG. 6 is a flowchart illustrating the process of a prior coding device.
Figure 7A:
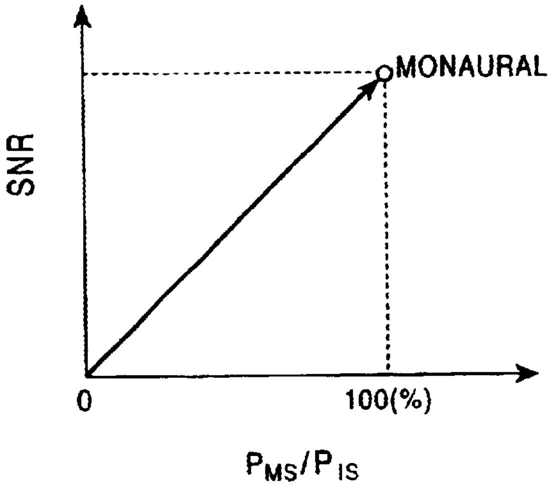
FIG. 7A PRIOR ART
FIGS. 7A, 7B, 7C, and 7D show the relationship between the operation of the prior coding device and a signal to be generated.
Figure 7B:
FIG. 7B PRIOR ART
Figure 7C:
FIG. 7C PRIOR ART
Figure 7D:
FIG. 7D PRIOR ART
Figure 8:
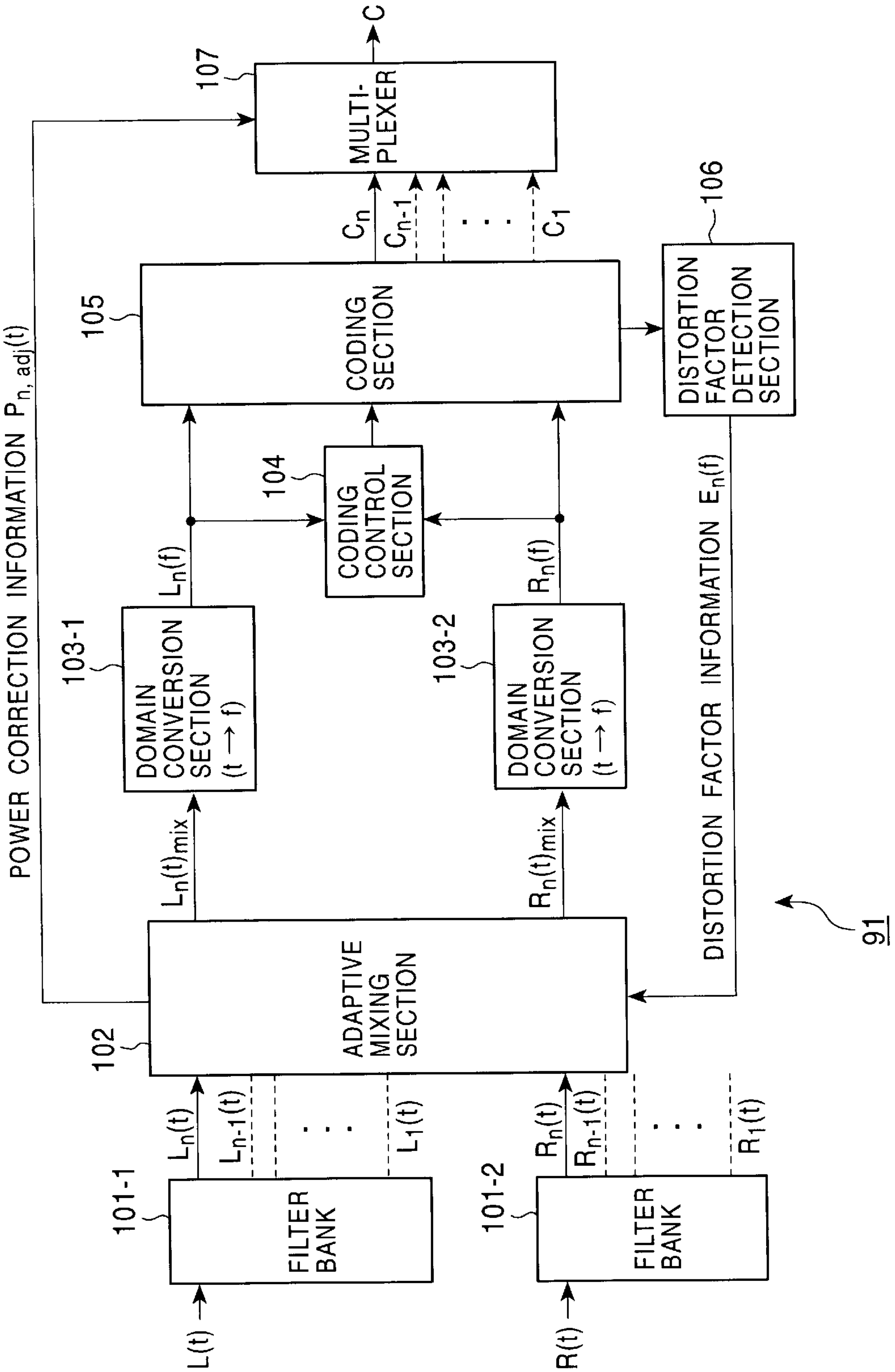
FIG. 8 is a block diagram showing an example of the construction of a coding device to which the present invention is applied.

FIG. 8 is a block diagram showing an example of the construction of a coding device to which the present invention is applied.

A filter bank 101-1 divides a left signal L(t) within an input audio signal into signals $L_n(t)$, $L_{n-1}(t)$, . . . , $L_1(t)$ of n frequency bands, and outputs the generated signal $L_n(t)$ to an adaptive mixing section 102. Also, similarly to the filter bank 101-1, a filter bank 101-2 divides a right signal R(t) within the input audio signal into signals $R_n(t)$, $R_{n-1}(t)$, . . . , $R_1(t)$ of n frequency bands, and outputs the generated signal $R_n(t)$ to the adaptive mixing section 102. Although not shown, for the signals $L_{n-1}(t), \ldots, L_1(t)$ and $R_{n-1}(t), \ldots, R_1(t)$, corresponding processing sections are also provided.

The adaptive mixing section 102 performs a mixing process on the signals $L_n(t)$ and $R_n(t)$ on the basis of distortion factor information $E_n(f)$ supplied from a distortion factor detection section 106 in order to generate signals $L_n(t)_{mix}$ and $R_n(t)_{mix}$ (the details thereof will be described later with reference to FIG. 9). The generated signals $L_n(t)_{mix}$ and $R_n(t)_{mix}$ are supplied to domain conversion sections 103-1 and 103-2, respectively. As will be described later, since the distortion factor detection section 106 generates distortion factor information $E_n(f)$ according to the results of the coding in a coding section 105, the mixing ratio is set to 0 in the initial state of the operation. That is, a mixing process is not performed on the signals $L_0(t)$ and $R_0(t)$.

Furthermore, the adaptive mixing section 102 creates power correction information $P_{n,adj}(t)$ for correcting the output of the left and right signals, and outputs it to a multiplexer 107.

The domain conversion section 103-1 performs domain conversion, such as MDCT (Modified Discrete Cosine Transform), on the supplied signal $L_n(t)_{mix}$, and outputs the generated spectrum signal $L_n(f)$ to a coding control section 104 and the coding section 105. Similarly, a domain conversion section 103-2 performs domain conversion on the supplied signal $R_n(t)_{mix}$ and outputs the generated spectrum signal $R_n(f)$ to the coding control section 104 and the coding section 105.

The coding control section 104 selects a coding method for the coding process performed by the coding section 105 on the basis of the spectrum signals $L_n(t)$ and $R_n(f)$ supplied from the domain conversion section 103, so that the coding section 105 is controlled.

The coding section 105 selects dual coding, MS stereo coding, or IS stereo coding under the control of the coding control section 104, codes the spectrum signals $L_n(t)$ and $R_n(f)$ supplied from the domain conversion section 103, and outputs the obtained data sequence $C_n$ to the multiplexer 107. The above processing is performed on the signals $L_{n-1}(t), \ldots, L_1(t)$ and $R_{n-1}(t), \ldots, R_1(t)$ in a similar manner.

The multiplexer 107 combines a code sequence $C_n$ of a predetermined band, supplied from the coding section 105 with the code sequences $C_{n-1}, \ldots, C_1$ of the other bands, and outputs the combined audio data C to a device (not shown) provided external to a coding device 91, a network, etc. The combined audio data C contains power correction information $P_{n,adj}(t)$ supplied from the adaptive mixing section 102 and information indicating by which coding method the signals are coded.

Figure 9:
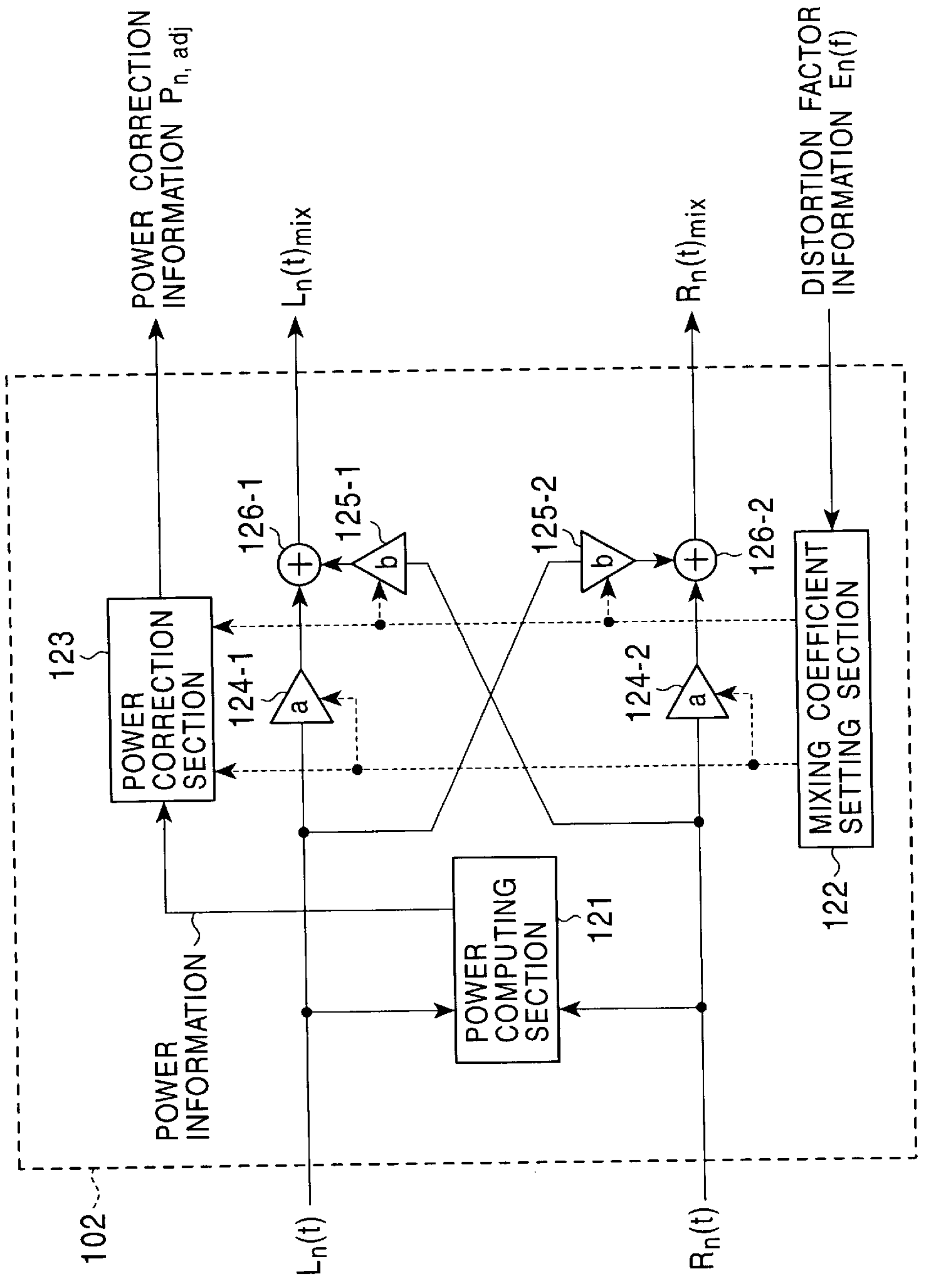
FIG. 9 is a block diagram showing an example of the construction of an adaptive mixing section of FIG. 8.

FIG. 9 is a block diagram showing a detailed example of the construction of the adaptive mixing section of FIG. 8.

A power computing section 121 computes the power values $Pl_n$ and $Pr_n$ from the signals $L_n(t)$ and $R_n(t)$ which are divided into predetermined bands by the filter banks 101-1 and 101-2, respectively, and outputs them to a power correction section 123.

A mixing coefficient setting section 122 extracts mixing coefficients from a table stored in a built-in storage section corresponding to the distortion factor information $E_n(f)$ supplied from the distortion factor detection section 106, and sets a mixing coefficient a of multipliers 124-1 and 124-2 and a mixing coefficient b of multipliers 125-1 and 125-2. Furthermore, the mixing coefficient setting section 122 supplies the extracted mixing coefficients a and b to the power correction section 123.

The multipliers 124-1 and 124-2 multiply the input signals $L_n(t)$ and $R_n(t)$ by the mixing coefficient a which is set by the mixing coefficient setting section 122, and outputs the obtained signal to adders 126-1 and 126-2, respectively. The multipliers 125-1 and 125-2 multiply the input signals $R_n(t)$ and $L_n(t)$ by the mixing coefficient b which is set by the mixing coefficient setting section 122, and outputs the obtained signal to the adders 126-1 and 126-2, respectively.

The adder 126-1 adds together the left signal Ln(t) with which the coefficient a is multiplied by the multiplier 124-1 and the right signal Rn(t) with which the coefficient b is multiplied by the multiplier 125-1, and outputs the added result, as a signal $L_n(t)_{mix}$, to the domain conversion section 103-1. Also, the adder 126-2 adds together the right signal Rn(t) with which the coefficient a is multiplied by the multiplier 124-1 and the left signal Ln(t) with which the coefficient b is multiplied by the multiplier 125-2, and outputs the added result, as a signal $R_n(t)_{mix}$, to the domain conversion section 103-2.

FIG. 10 shows an example of a correspondence table of distortion factor information $E_n(f)$, stored in a storage section (not shown) of the mixing coefficient setting section 122 and the mixing coefficients a and b.

In this example, the distortion factor information $E_n(f)$ is expressed as a percentage, and hereinafter this value will be referred to as "E". For example, E=0% means that the perceptible noise is zero. Also, E=100% means that the noise is at a perceptible level in all the spectral domains.

In this example, mixing coefficients a=1.00 and b=0.00 are set in such a manner as to correspond to the distortion factor E=0%. In this case, since the input left and right signals $L_n(t)$ and $R_n(t)$ are not mixed, coding is performed in a completely separated state (completely stereo). Also, mixing coefficients a=0.50 and b=0.50 are set in such a manner as to correspond to the distortion factor E=100%. In this case, the input left and right signals $L_n(t)$ and $R_n(t)$ are mixed at the same ratio, and coding is performed in a completely unified state (completely monaural).

The power correction section 123 creates power correction information $P_{n,adj}(t)$ which is used when power correction is performed in a decoding device (FIG. 19) (to be described later) on the basis of the power values $Pl_n$ and $Pr_n$ supplied from the power computing section 121 and the mixing coefficients a and b supplied from the mixing coefficient setting section 122, and outputs them to the multiplexer 107. That is, the power correction section 123 has stored, in a storage section (not shown), the correspondence table in which the relationships among the power correction information $P_{n,adj}(t)$, the mixing coefficients a and b, and the power values $Pl_n$ and $P_{rn}$.

FIG. 11 shows an example of the correspondence table stored in the power correction section 123.

In this example, the power values $Pl_n$ and $Pr_n$ computed in the power computing section 121, the distortion factor information $E_n(f)$, the mixing coefficients a and b, the power values $Pl_{nmix}$ and $Pr_{nmix}$ of signals $L_n'(t)_{mix}$ and $R_n'(t)_{mix}$ to be regenerated in the decoding device 151, and the power correction information $P_{n,adj}(t)$ are made to correspond to each other. In this example, the power correction information $P_{n,adj}(t)$ is represented using power weighting coefficients c and d which are set in the decoding device 151.

For example, as shown in the second row of FIG. 11, when the power value of the signal $L_n(t)$ is $Pl_n$=1.0, the power value of the signal $R_n(t)$ is $Pr_n$=1.0, and the distortion factor E=0%, the mixing coefficients are set as a=1.00 and b=0.00 from the correspondence table shown in FIG. 10.

The power value of the signal $L_n'(t)_{mix}$ in the decoding device 151 is set as $Pl_{nmix}$=1.0 and the power value of the signal $R'_n(t)_{mix}$ is set as $Pr_{nmix}$=1.0. Since the power correction information $P_{n,adj}(t)$ contains a coefficient which causes the regenerated signal to approach the input signal, the coefficient for correcting the power of the signal $L'_n(t)_{mix}$ is set to c=1.00, and the coefficient for correcting the power of the signal $R'_n(t)_{mix}$ is set to d=1.00.

Figure 12:
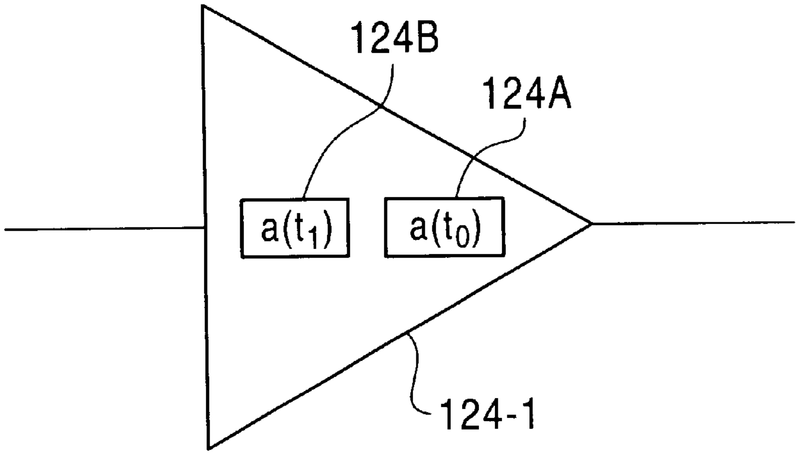
FIG. 12 shows an example of the construction of a multiplier of FIG. 9.

FIG. 12 is a block diagram showing a detailed example of the construction of the multiplier 124-1 (although not shown, the multiplier 124-2 is also similarly constructed).

In this example, buffers 124A and 124B are provided. At the current time (time t=0), the set mixing coefficient a(t0) is stored in the buffer 124A, and the mixing coefficient a(t1) which was set immediately before (which has been set at time t=1) is stored in the buffer 124B.

Figure 13:
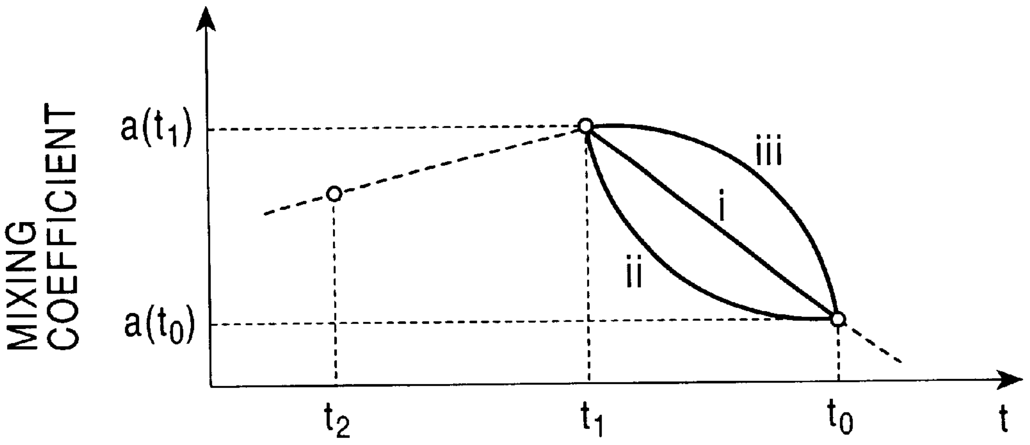
FIG. 13 shows an example of an interpolation function of a mixing coefficient.

When the mixing coefficient is changed, there are cases in which a noncontinuous point occurs in the signal which is output at that time. Therefore, as indicated in curves i to iii of FIG. 13, the occurrence of a noncontinuous point can be prevented by changing the mixing coefficient in a manner of a straight line or in a manner of a curve. Although in this example, two buffers are provided, three or more buffers may be provided. A degree of the interpolation function which interpolates each mixing coefficient may be one, two, three, etc. Of course, similarly, a buffer may be provided in multipliers 125-1 and 125-2, so that the mixing coefficient b is stored and the mixing coefficient is changed on the basis of the interpolation function.

Figure 14:
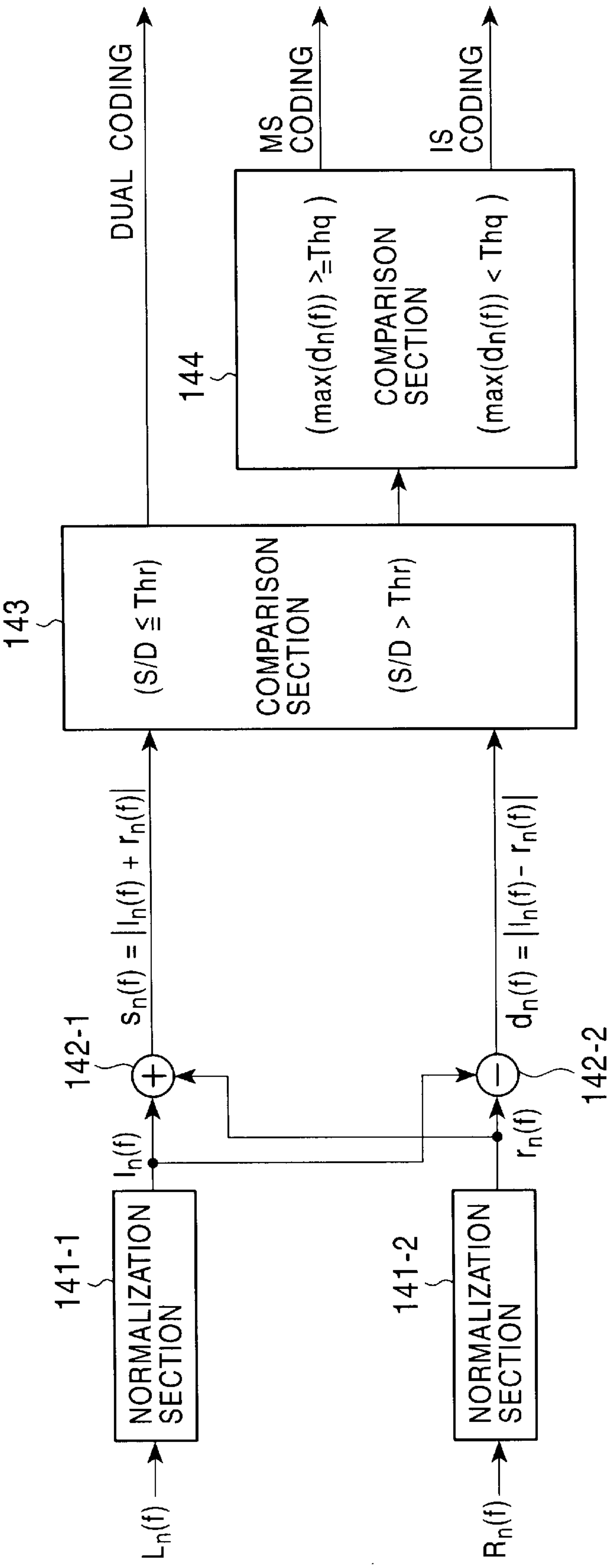
FIG. 14 is a block diagram showing an example of the construction of a coding control device of FIG. 8.

FIG. 14 is a block diagram showing a detailed example of the construction of the coding control device 104 of FIG. 8.

A normalization section 141-1 normalizes the spectrum signal $L_n(f)$ input from the domain conversion section 103-1 for each divided frequency band or for each range of a small domain in which spectra within the same divided frequency band are collected at several spectral signal in order to generate a normalized spectrum signal $l_n(f)$, and outputs it to adders 142-1 and 142-2. Similarly, the adder 142-2 normalizes the spectrum signal $R_n(f)$ input from the domain conversion section 103-2 in order to generate a normalized spectrum signal $r_n(f)$, and outputs it to the adders 142-1 and 142-2. The normalized spectrum signals $l_n(f)$ and $r_n(f)$ are added together or the normalized spectrum signal $l_n(f)$ is subtracted he normalized spectrum signal $r_n(f)$ in the spectrum in the adders 142-1 and 142-2, respectively, and the generated signals $s_n(f)(=|l_n(f)+r_n(f)|)$ and $d_n(f)(=|l_n(f)-r_n(f)|)$ are supplied to a comparator 143.

The comparator 143 computes the total sum values S and D for each divided frequency band of each of the input signals sn and dn, and selects, based on the ratio S/D thereof, the coding method for the spectrum signals $L_n(f)$ and $R_n(f)$, performed in the coding section 105. In the comparator 143, it is determined whether or not coding should be performed by dual coding. Which one of MS stereo coding and IS stereo coding is used to code the spectrum signals $L_n(f)$ and $R_n(f)$ is determined in a comparator 144 (to be described later).

The comparator 144, based on the difference components $d_n(f)(=l_n(f)-r_n(f))$ of the normalized spectrum signals $l_n(f)$ and $r_n(f)$ supplied from the comparator 143, selects a coding method from MS stereo coding and IS stereo coding, which is to be used to code the spectrum signals $L_n(f)$ and $R_n(f)$.

Figure 15:
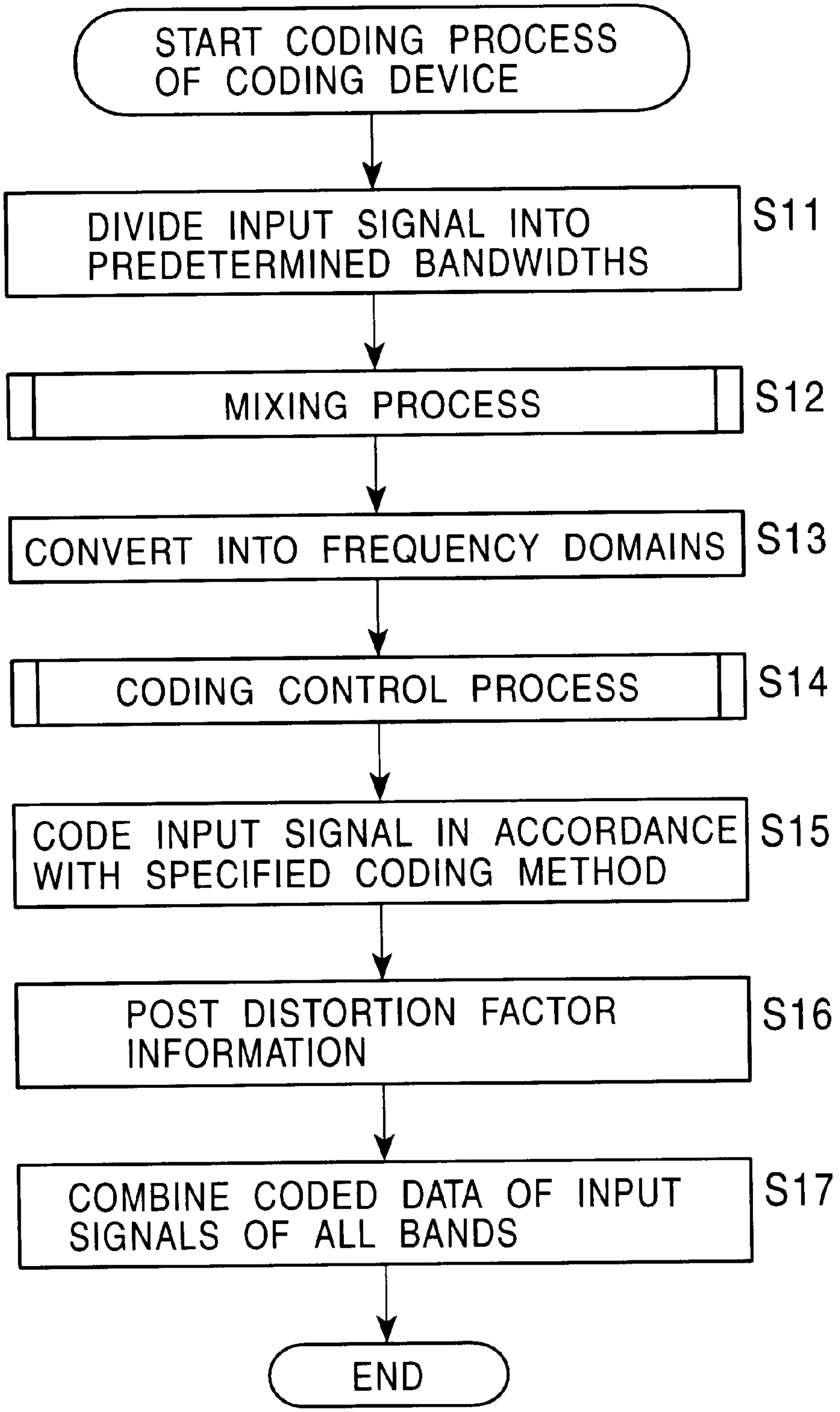
FIG. 15 is a flowchart illustrating the process of the coding device of FIG. 8.

Next, the operation of the coding device 91 of FIG. 8 will be described with reference to the flowchart in FIG. 15.

In step S11, a filter bank 101 divides an input audio signal for each predetermined frequency band, and outputs the generated signals to the adaptive mixing section 102. That is, the filter bank 101-1 divides the left signal L(t) into n bands, and outputs the left signal $L_n(t)$ to the adaptive mixing section 102. Also, the filter bank 101-2 divides the right signal R(t) into n bands, and outputs the right signal R(t) to the adaptive mixing section 102.

In step S12, the adaptive mixing section 102 performs a mixing process on the input signals $L_n(t)$ and $R_n(t)$ on the basis of the distortion factor information $E_n(f)$ supplied from the distortion factor detection section 106. The details of the mixing process will be described later with reference to the flowchart in FIG. 16.

The signals $L_n(t)_{mix}$ and $R_n(t)_{mix}$ generated by the mixing process are supplied to the domain conversion section 103. In step S13, these signals are converted from the time domain to the frequency domain by MDCT, etc., and the spectrum signals $L_n(t)$ and $R_n(f)$ after conversion are output to the coding control section 104 and the coding section 105.

In step S14, the coding control section 104 performs a process for controlling the coding method of the spectrum signals $L_n(f)$ and $R_n(f)$ input to the coding section 105. The details of the coding control process will be described later with reference to the flowchart in FIG. 17.

In step S15, the coding section 105 selects dual coding, MS stereo coding, or IS stereo coding in accordance with the instructions from the coding control section 104, codes the spectrum signals $L_n(f)$ and $R_n(f)$ supplied from the domain conversion section 103 in accordance with the selected method, and outputs the obtained code sequence $C_n$ to the multiplexer 107. Which coding method was used to code the signals is uniquely determined in the decoding device 151, for example, in accordance with a combination of information for identifying a codebook to which a reference is made, information about the accuracy of quantization, the normalization information, etc., when a spectrum signal is coded.

The distortion factor detection section 106 detects the distortion factor of the coding process performed in the coding section 105, and creates distortion factor information $E_n(f)$. The created distortion factor information $E_n(f)$ is supplied to the adaptive mixing section 102 in step S16, and is used for processing in step S16 and subsequent steps. The above processing is performed in all bands.

In step S17, the multiplexer 107 combines the code sequence $C_n$ supplied from the coding section 105 with the code sequences $C_{n-1}, C_{n-2}, \ldots, C_1$ from the coding sections of the other bands, and outputs the obtained code sequence C to a device (not shown) provided external to the coding device 91 or outputs it to a network, etc. The code sequence C contains information, such as power correction information $P_{n,adj}(t)$ supplied from the adaptive mixing section 102.

Figure 16:
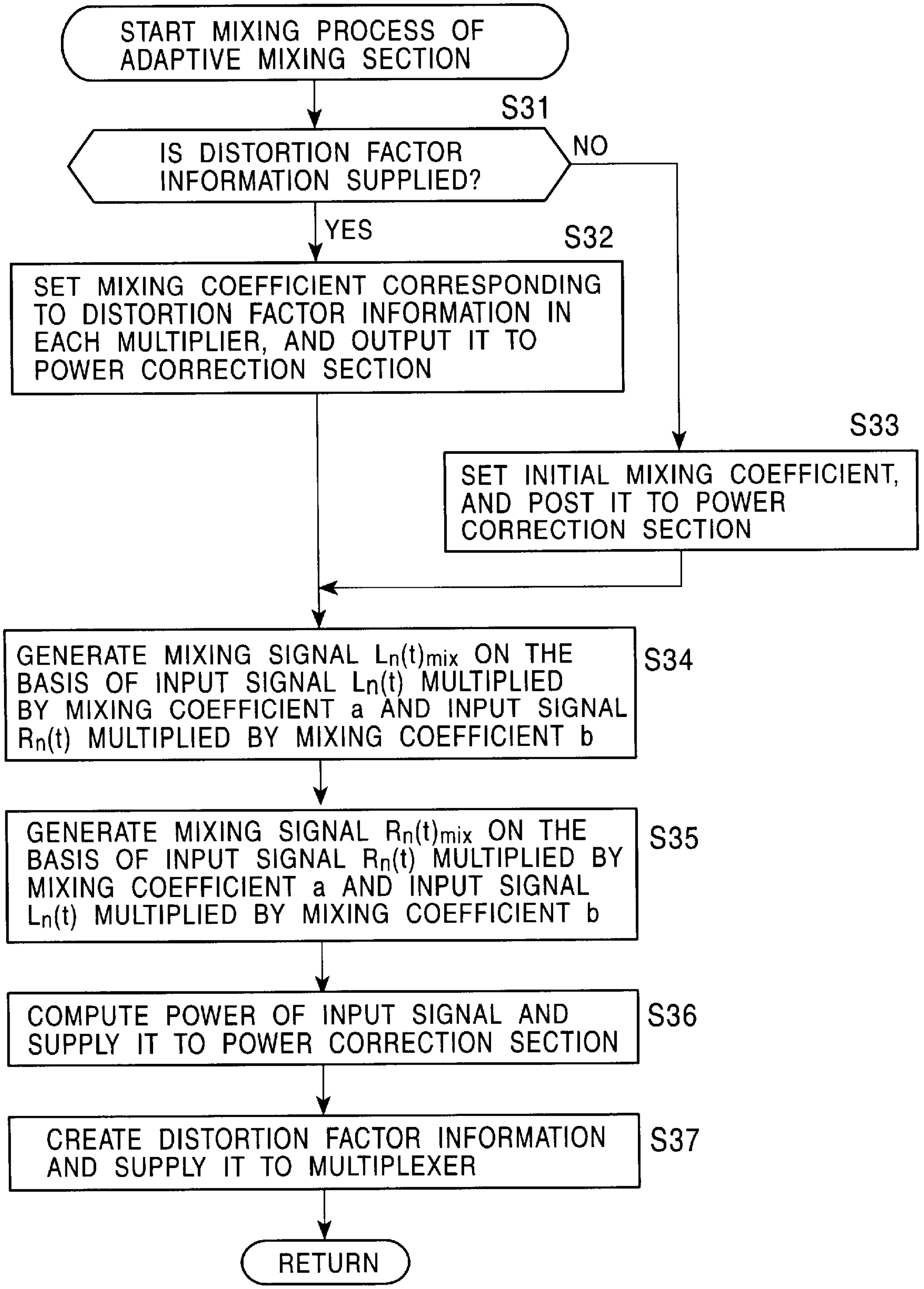
FIG. 16 is a flowchart illustrating the details of a process performed in step S12 of FIG. 15.

Next, referring to the flowchart in FIG. 16, a description will be given of the mixing process of the adaptive mixing section 102 performed in step S12 of FIG. 15.

In step S31, the mixing coefficient setting section 122 determines whether or not distortion factor information $E_n(f)$ is supplied from the distortion factor detection section 106. When it is determined that the distortion factor information $E_n(f)$ is supplied, the process proceeds to step S32, where the mixing coefficients a and b of the multipliers 124 and 125 are set on the basis of the distortion factor information $E_n(f)$. When, for example, the fact that the distortion factor E is 100% is supplied, the mixing coefficient setting section 122 extracts mixing coefficients a=0.95 and b=0.05 from the correspondence table such as that shown in FIG. 10, sets the mixing coefficient a of the multiplier 124 to 0.95, and sets the mixing coefficient b of the multiplier 125 to 0.05. The mixing coefficient setting section 122 supplies the set mixing coefficients to the power correction section 123.

On the other hand, when it is determined in step S31 that the distortion factor information $E_n(f)$ is not supplied from the distortion factor detection section 106, in step S33, the mixing coefficient setting section 122 sets the initial mixing coefficients in the multipliers 124 and 125, respectively. That is, as described above, in the initial state, the distortion factor E is set to 100%, and the mixing coefficients a and b are set to 1.00 and b=0.00, respectively.

In step S34, the adder 126-1 adds together the signal obtained by multiplying the left signal $L_n(t)$ by the mixing coefficient a in the multiplier 124-1 and the signal obtained by multiplying the right signal $R_n(t)$ by the mixing coefficient b in the multiplier 125-1, generates a mixing signal $L_n(t)_{mix}$, and outputs it to the domain conversion section 103-1.

In step S35, the adder 126-2 adds together the signal obtained by multiplying the right signal $R_n(t)$ by the mixing coefficient a in the multiplier 124-2 and the signal obtained by multiplying the left signal $L_n(t)$ by the mixing coefficient b in the multiplier 125-2, generates a mixing signal $R_n(t)_{mix}$, and outputs it to the domain conversion section 103-2.

More specifically, when the above-described mixing coefficients (a=0.95 and b=0.05) are set in the multipliers 124 and 125 in steps S34 and S35, one of the left and right signals $L_n(t)$ and $R_n(t)$ is output to the domain conversion section 103 after 5% of the other is mixed. Also, in the case of the initial state, and the signals are output to the domain conversion section 103 in a completely stereo state in which the left and right signals $L_n(t)$ and $R_n(t)$ are not mixed.

In step S36, the power computing section 121 computes the power values $Pl_n$, and $Pr_n$ of the signals $L_n(t)$ and $R_n(t)$ which are divided into predetermined bands by the filter bank 101, and supplies the power values to the power correction section 123.

In step S37, the power correction section 123 creates power correction information $P_{n,adj}(t)$ which is used when power correction is performed in the decoding device 151 (to be described later) (see FIG. 19) on the basis of the power values $Pl_n$ and $Pr_n$ of the signals $L_n(t)$ and $R_n(t)$ supplied from the power computing section 121 and the mixing coefficients a and b supplied from the mixing coefficient setting section 122, and outputs them to the multiplexer 107.

For example, when the fact that the power value $Pl_n$ of the signal $L_n(t)$ is 5.0 and the power value $Pr_n$ of the signal $R_n(t)$ is 1.0 is supplied from the power computing section 121 and the fact that the mixing coefficients a=0.75 and b=0.25 is supplied from the mixing coefficient setting section 122 (in the case of the distortion factor E=50%), as indicated in the fourth row from the top in FIG. 11, then c=1.25 and d=0.50 are extracted as the power correction information $P_{n,adj}(t)$ (power weighting coefficient). That is, in the decoding device 151, since the signal $L'_n(t)_{mix}$, which is obtained when the data of the signal $L_n(t)$ is decoded, is reproduced with the power value $Pl_{nmix}$=4.0 and the signal $R'_n(t)_{mix}$, which is obtained when the data of the signal $R_n(t)$ is decoded, is reproduced with the power value $Pr_{nmix}$=2.0, power weighting coefficients c and d, which become equal to the input signal when these are multiplied by the regenerated signal, are extracted, and these are output to the multiplexer 107.

For example, when the distortion factor is high, the adaptive mixing section 102 sets the mixing coefficient so that the left and right signals are changed in a monaural manner, so that the operation probability of the MS stereo coding or the IS stereo coding is increased. As a result, the SNR can be increased, and the distortion factor can be decreased. Furthermore, as described above, as a result of setting the mixing coefficient on the basis of the feedback distortion factor information, a region having a high correlation is created in a region where there is not a high correlation in the regions of the normalized spectrum signals $l_n(f)$ and $r_n(f)$. Furthermore, in the decoding device, since power correction is performed based on the power correction information $P_{n,adj}(t)$, the separation of the left and right signals is maintained.

Figure 17:
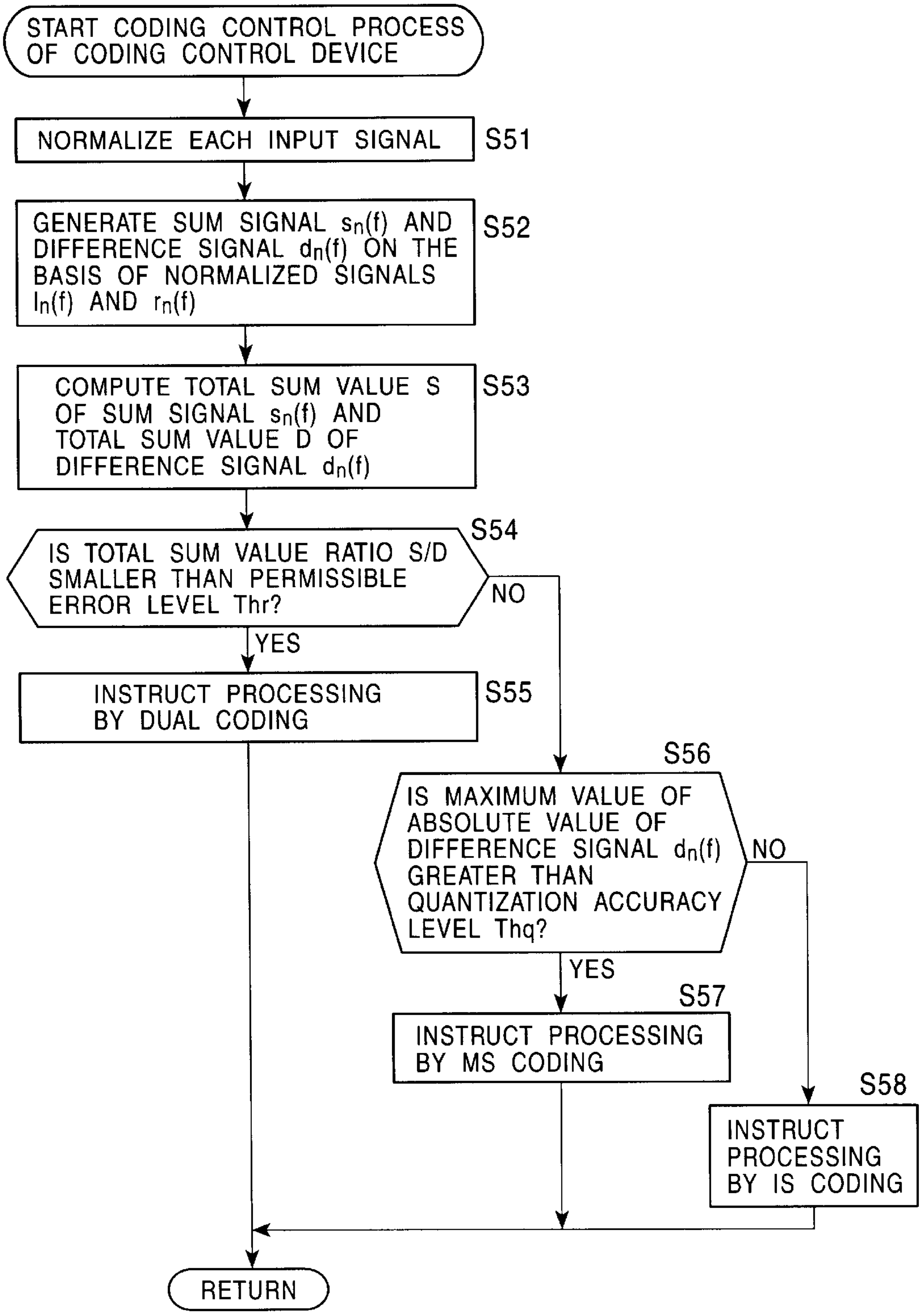
FIG. 17 is a flowchart illustrating the details of a process performed in step S14 of FIG. 15.

Next, referring to the flowchart in FIG. 17, a description will be given of the coding control process of the coding control section 104 performed in step S14 of FIG. 15.

In step S51, the normalization section 141 normalizes the input signal for each divided frequency band or for each range of a small domain in which spectra within the same divided frequency band are collected at several spectral signal. The generated normalized spectral signals $l_n(f)$ and $r_n(f)$ are supplied to the adder 142-1 and the subtracter 142-2. In step S52, the sum signal $s_n(f)(=|l_n(f)+r_n(f)|)$ of the normalized spectrum signals is generated by the adder 142-1, and the difference signal $d_n(f)(=|l_n(f)-r_n(f)|)$ is generated by the subtracter 142-2. The generated sum signal $s_n(f)$ and the generated difference signal $d_n(f)$ of the normalized spectrum signals are supplied to the comparator 143.

In step S53, the comparator 143 computes the total sum value S of all the bands of the input signal $s_n(f)$ on the basis of the following equation (1) and computes the total sum value D in the range where the signal $d_n(f)$ is normalized on the basis of the following equation (2):

$$S=\sum_{f=f_0}^{f_1-1}|S_n(f)| \tag{1}$$

$$D=\sum_{f=f_0}^{f_1-1}|d_n(f)| \tag{2}$$

where f0 indicates the start spectrum number in the normalized range, and f1 indicates the end spectrum number.

The more similar (the higher the correlation) the normalized spectrum signal $l_n(f)$ and the normalized spectrum signal $r_n(f)$ are to each other, the larger the total sum value S and the smaller the total sum value D. In contrast, when the normalized spectrum signal $l_n(f)$ and the normalized spectrum signal $r_n(f)$ differ from each other (the correlation is lower), since the total sum value S and the total sum value D become substantially the same values, by computing the ratio of the total sum values S and D (total sum value ratio S/D), the correlation between the normalized spectrum signal $l_n(f)$ and the normalized spectrum signal $r_n(f)$ can be obtained. For example, when the value of the total sum value ratio S/D is greater than "1", this indicates that the correlation between the normalized spectrum signal $l_n(f)$ and the normalized spectrum signal $r_n(f)$ is high.

Then, in step S54, the comparator 143 determines whether or not the total sum value ratio S/D computed in step S53 is smaller than a permissible error level (threshold value) Thr which is set in advance for each divided frequency band or for each small normalized domain. When it is determined by the comparator 143 that the total sum value ratio S/D is smaller than the permissible error level Thr, the process proceeds to step S55, where a selection is made such that the spectrum signals $L_n(f)$ and $R_n(f)$ input to the coding section 105 are coded by dual coding, and this is supplied to the coding section 105. That is, the permissible error level is set so that if the total sum value ratio S/D is equal to or greater than a predetermined level (if there is a correlation over a predetermined level between the normalized spectrum signal $l_n$(f) and the normalized spectrum signal $r_n$(f)), coding is forcedly performed by MS or IS stereo coding. In this embodiment, the correlation between the normalized spectrum signal $l_n$(f) and the normalized spectrum signal $r_n$(f) is determined by using the ratio of the total sum value S to D. However, of course, the correlation determination method is not limited to this, and the determination may be performed by using another parameter, such as a correlation coefficient being obtained by comparing the absolute value of $l_n$(f) with that of $r_n$(f).

On the other hand, when it is determined in step S54 that the total sum value ratio S/D is equal to or greater than the permissible error level Thr, the comparator 143 supplies that fact to the comparator 144. Then, in step S56, the comparator 144 determines whether or not the maximum value of $d_n$(f) with respect to the spectrum of the target band is greater than the quantization accuracy level which can be realized by the decoding device 151. That is, the comparator 144 selects MS stereo coding when the difference signal $d_n$(f) needs to be coded, and when the sum signal $d_n$(f) need not to be coded, the comparator 144 selects IS stereo coding.

When it is determined in step S56 by the comparator 144 that the maximum value of $d_n$(f) is greater than the quantization accuracy level Thq, the process proceeds to step S57, where a selection is made such that the spectrum signals $L_n$(f) and $R_n$(f) input to the coding section 105 are coded by MS stereo coding, and this is supplied to the coding section 105. Also, when it is determined in step S56 by the comparator 144 that the maximum value of $d_n$(f) is equal to or smaller than the quantization accuracy level Thq, the process proceeds to step S58, where a selection is made such that the spectrum signals $L_n$(f) and $R_n$(f) input to the coding section 105 are coded by IS stereo coding is selected, and this is supplied to the coding section 105.

As a result, even if there is a high correlation between the normalized spectrum signal $l_n$(f) and the normalized spectrum signal $r_n$(f), and even if there is a possibility that a higher SNR can be realized by dual coding than MS or IS stereo coding, when the total sum value ratio S/D is higher than the threshold value at which hearing as noise is not possible, the input signal is coded by MS or IS stereo coding.

Furthermore, even when the difference signal $d_n$(f) is not coded, since the information about the normalization of the left and right signals is coded, IS stereo coding can be considered as being equivalent to MS stereo coding. As a result, there is no need to separately provide a processing section for performing MS stereo coding and a processing section for performing IS stereo coding, and the coding device 91 can be formed to be smaller.

The permissible error level Thr is set according to the construction of the coding system, such as the block length of domain conversion and bit allocation. And, for the quantization accuracy level Thq, a highest quantization accuracy level which can be realized by the coding device 91 may be set, or a quantization accuracy level Thq(f) may be set for each frequency band. That is, similarly to the permissible error level Thr, the quantization accuracy level Thq is also set according to the system.

Figure 18A:
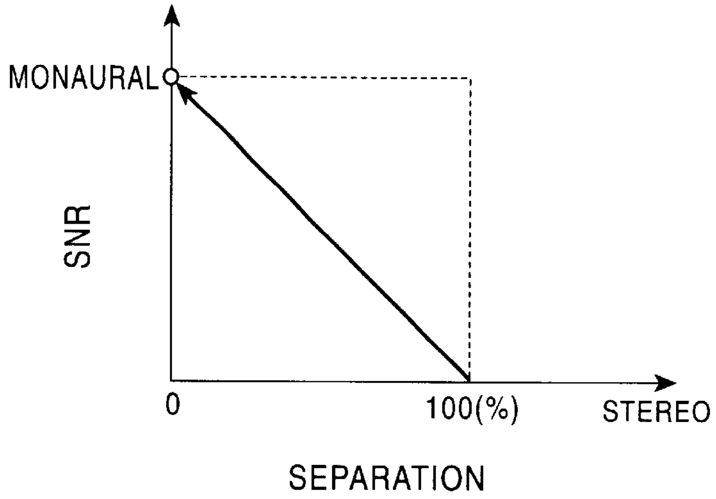
FIGS. 18A, 18B, 18C, and 18D show the relationship between the operation of the coding device of FIG. 8 and a signal to be generated.
Figure 18B:
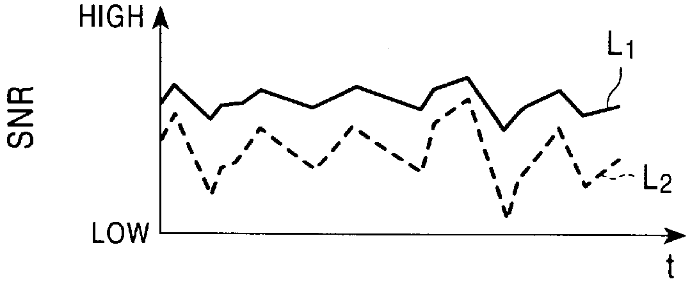
Figure 18C:
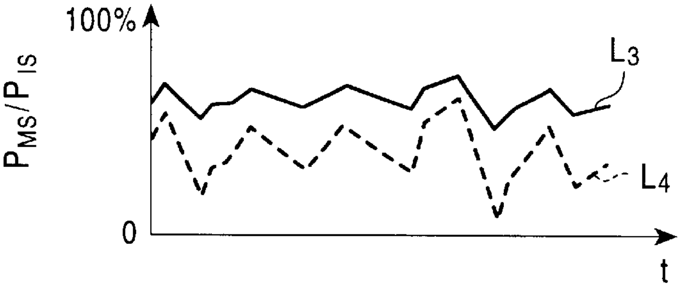
Figure 18D:
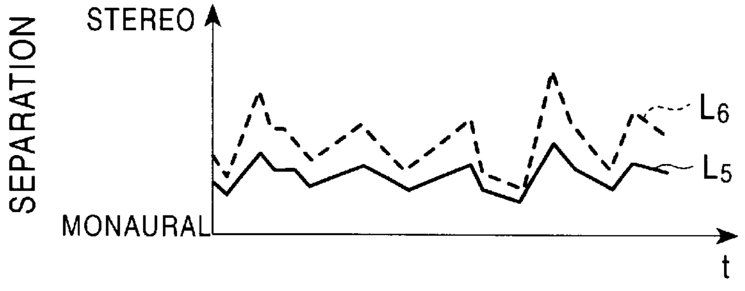

FIG. 18A shows the relationship between the separation and the signal-to-noise ratio SNR in the coding device 91. FIG. 18B shows the change in the signal-to-noise ratio SNR of the coded (normalized) signal with respect to time. FIG. 18C shows the change in the operation time probability $P_{MS}$ of MS stereo coding or the change in the operation time probability $P_{IS}$ of IS stereo coding with respect to time. FIG. 18D shows the change in the separation of the left and right signals $L_n$(t) and $R_n$(t) signals with respect to time.

As shown in FIGS. 18B and 18C, since the signal-to-noise ratio SNR is linked with the operation time probability $P_{MS}$ of MS stereo coding or the operation time probability $P_{IS}$ of IS stereo coding, by varying the mixing coefficient appropriately as described above, SNR can be improved by controlling the probability $P_{MS}$ or $P_{IS}$. This makes it possible to improve the sound quality.

And, as shown in FIG. 18A, as the SNR is improved, the separation of the left and right signals becomes poorer (becomes to be monaural). Consequently, as shown in FIG. 18D, the separation becomes poorer in response to the variations of the SNR shown in FIG. 18A. However, as described above, since the power correction information $P_{n,adj}$(t) is created, and power adjustment is performed during decoding, the separation of the left and right signals can also be improved. In FIGS. 18B, 18C, and 18D, lines L1, L3, and L5 indicate the characteristics of the coding device 91 of FIG. 8, and lines L2, L4, and L6 indicate the characteristics of a prior coding device.

In the above-described embodiment of the present invention, the distortion factor of coding is detected, a mixing coefficient is set according to that value, and the input signal of the next timing is mixed. In addition, the construction may be formed in such a way that the input signal of a predetermined band is repeatedly mixed until the distortion factor becomes equal to or smaller than a predetermined threshold value. In this case, the signal $L_n$(t) generated by the filter bank 101-1 and the signal $R_n$(t) generated by the filter bank 101-2 are stored in a memory (not shown), etc., and mixing, domain conversion, and coding are performed again on the basis of the distortion factor information $E_n$(f) which is fed back to the adaptive mixing section 102.

Figure 19:
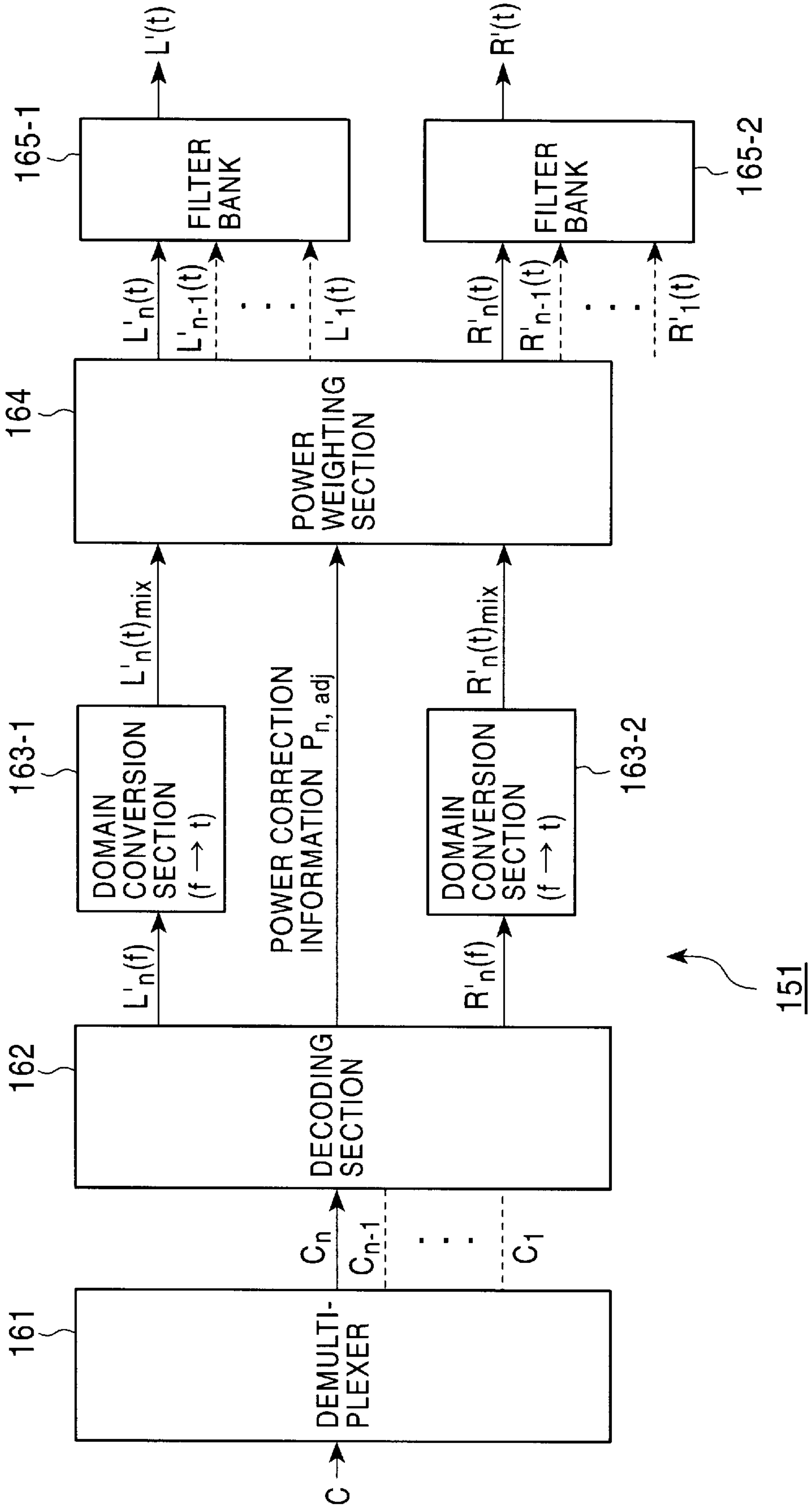
FIG. 19 is a block diagram showing an example of the construction of a decoding device to which the present invention is applied.

FIG. 19 is a block diagram showing an example of the construction of a decoding device to which the present invention is applied.

A demultiplexer 161 divides the code sequence C supplied via a transmission line (not shown) into code sequences $C_n$, $C_{n-1}$, . . . , $C_1$ for each predetermined band, and outputs each code sequence $C_i$ to a corresponding decoding section (for the sake of convenience of description, only a decoding section 162 is shown). The code sequence $C_n$ is supplied to the decoding section 162.

The decoding section 162 decodes the input code sequence $C_n$ by a decoding method corresponding to the coding method, outputs the obtained spectrum signal $L'_n$(f) to a domain conversion section 163-1, and outputs the obtained spectrum signal $R'_n$(f) to a domain conversion section 163-2. Furthermore, the decoding section 162 supplies the power correction information $P_{n,adj}$(t) obtained from the code sequence $C_n$ to a power weighting section 164.

The domain conversion section 163 converts the input spectrum signals $L'_n$(f) and $R'_n$(f) into signals of the time domain by using inverse MDCT, etc., and outputs the obtained signals $L'_n(t)_{mix}$ and $R'_n(t)_{mix}$ to a power weighting section 164.

The power weighting section 164 performs power correction on the signals $L'n(t)_{mix}$ and $R'n(t)_{mix}$ supplied from the domain conversion section 163 on the basis of the power weighting coefficient contained in the supplied power correction information $P_{n,adj}$(t), and outputs the generated signal L'n(t) to a filter bank 165-1 and outputs the generated signal R'n(t) to a filter bank 165-2.

The filter bank 165 combines the signals L'n(t) and R'n(t) supplied from the power weighting section 164 with the signals $L'_{n-1}(t), \ldots, L'_1(t)$ and $R'_{n-1}(t), \ldots, R'_1(t)$ of the other bands, and outputs the generated audio signals L'(t) and R'(t) of all the bands to outside the decoding device 151.

Figure 20:
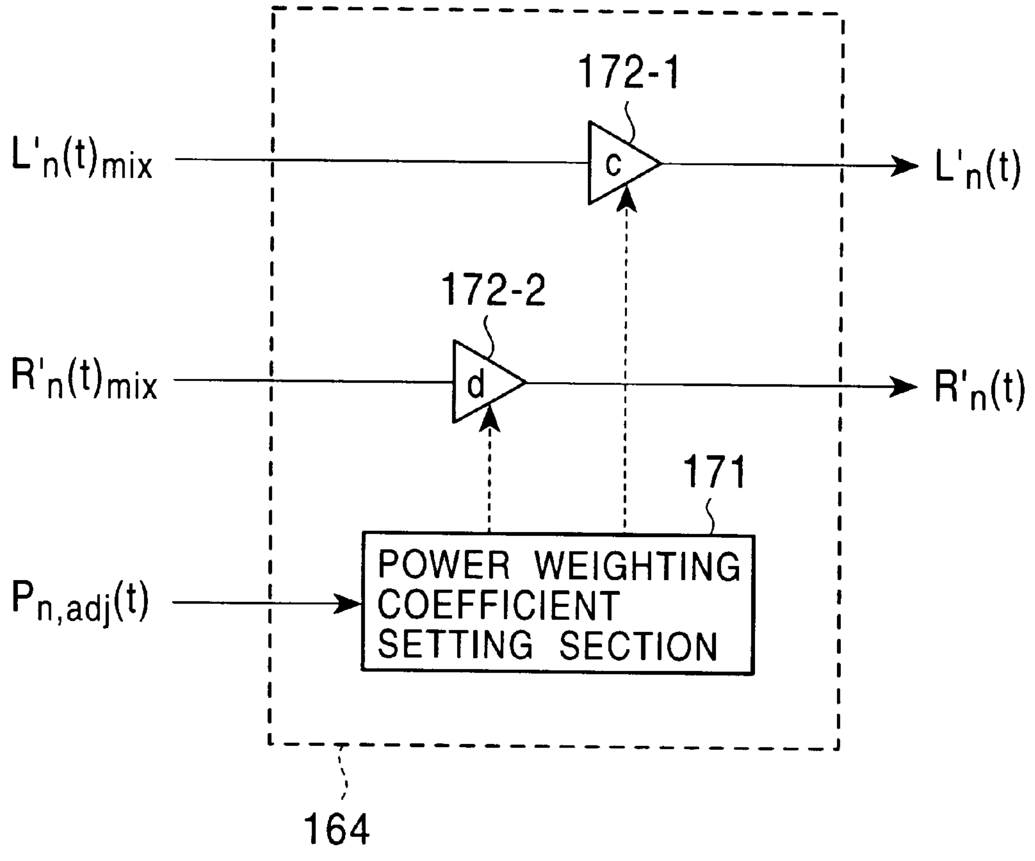
FIG. 20 is a block diagram showing an example of the construction of a power weighting section of FIG. 19.

FIG. 20 is a block diagram showing a detailed example of the construction of the power weighting section 164.

A power weighting coefficient setting section 171 sets a power weighting coefficient c contained in the supplied power correction information $P_{n,adj}(t)$ in a multiplier 172-1 and sets a power weighting coefficient d in a multiplier 172-2.

The multiplier 172-1 multiplies the input signal $L'_n(t)_{mix}$ by the power weighting coefficient c. The multiplier 172-2 multiplies the input signal $R'_n(t)_{mix}$ by the power weighting coefficient d. The obtained signals $L'_n(t)$ and $R'_n(t)$ are output to the filter banks 165-1 and 165-2, respectively.

Figure 21:
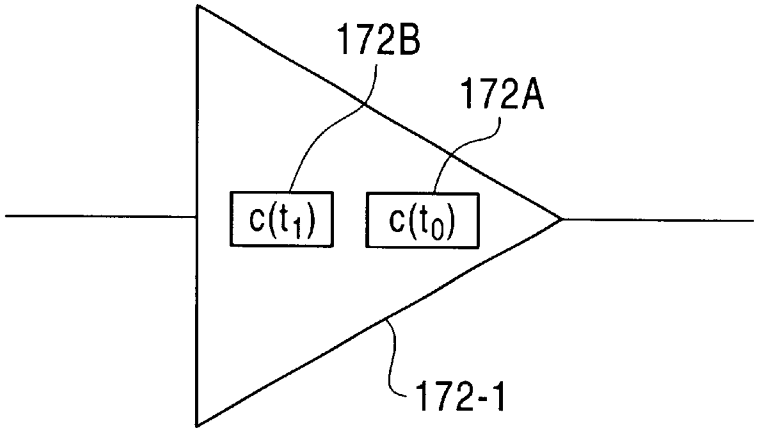
FIG. 21 is a block diagram showing an example of the construction of a multiplier of FIG. 20.

FIG. 21 is a block diagram showing a detailed example of the construction of the multiplier 172-1 (although not shown, the multiplier 172-2 is also similarly constructed).

In this example, buffers 172A and 172B are provided. At the current time (time t=0), the set power weighting coefficient c(t0) is stored in the buffer 172A, and the power weighting coefficient c(t1) which was set immediately before (which has been set at time t=1) is stored in the buffer 172B.

Figure 22:
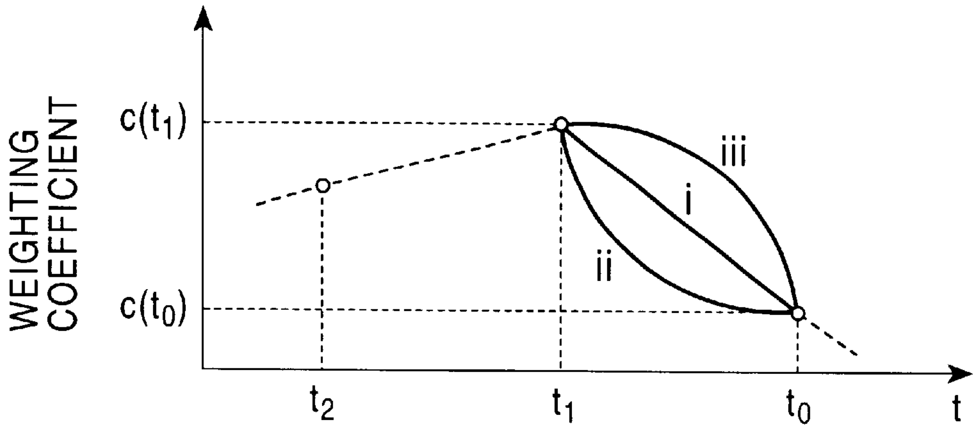
FIG. 22 shows an example of an interpolation function of a power weighting coefficient.

More specifically, when the power weighting coefficient c(t) is changed, there are cases in which a noncontinuous point occurs in the signal output at that time. Therefore, as indicated in lines i to iii of FIG. 22, the occurrence of a noncontinuous point can be prevented by changing the power weighting coefficient c(t) in a manner of a straight line or in a manner of a curve. Although in this example, two buffers are provided, three or more buffers may be provided. A degree of the interpolation function which interpolates each power weighting coefficient may be one, two, three, etc.

Figure 23:
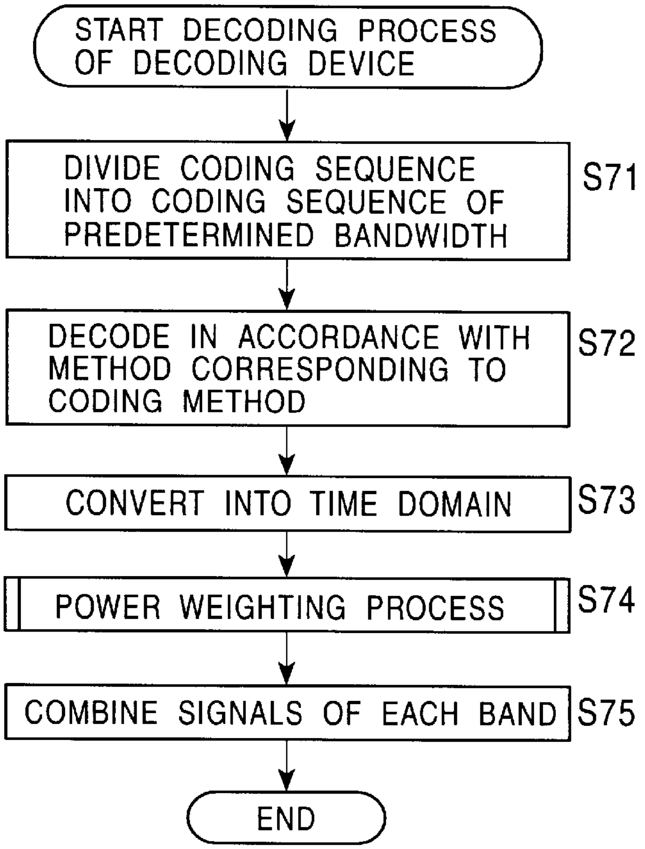
FIG. 23 is a flowchart illustrating the process of the decoding device of FIG. 19.

Next, referring to the flowchart in FIG. 23, the decoding process of the decoding device 151 of FIG. 19 will be described.

In step S71, the demultiplexer 161 divides the input code sequence C to code sequences $C_n, C_{n-1}, \ldots, C_1$ of a predetermined number of bands n, and outputs them to the corresponding decoding sections.

In step S72, the decoding section 162 selects a decoding method on the basis of a combination of normalization information, quantization accuracy information, a codebook number, etc., decodes the input code sequence $C_n$, outputs the obtained spectrum signal L'n(f) to the domain conversion section 163-1, and outputs the spectrum signal R'n(f) to the domain conversion section 163-2. Furthermore, the decoding section 162 outputs the power correction information $P_{n,adj}(t)$ obtained from the code sequence $C_n$ to the power weighting section 164.

In step S73, the domain conversion sections 163-1 and 163-2 convert the input spectral signals $L'_n(f)$ and $R'_n(f)$ into the signals in the time domain by using inverse MDCT, etc., and outputs the obtained signals $L'_n(t)_{mix}$ and $R'_n(t)_{mix}$ to the power weighting section 164. The signals $L'_n(t)_{mix}$ and $R'_n(t)_{mix}$ are signals having a possibility that mixing was performed in the coding device 91, and there are cases in which the originally stereo signal is changed to a substantially monaural signal. Therefore, in step S74, the power weighting section 164 performs a power weighting process on the basis of the supplied power correction information $P_{n,adj}(t)$, thereby reproducing a pseudo-stereo signal. The details of the power weighting process will be described later with reference to the flowchart in FIG. 24.

The signals $L'_n(t)$ and $R'_n(t)$ obtained by the power weighting process are output to the filter banks 165-1 and 165-2, respectively. The above process is performed for each band.

Then, in step S75, the filter bank 165 combines the signals $L'_n(t)$ and $R'_n(t)$ supplied from the power weighting section 164 with the signals $L'_{n-1}(t)$ $L'_1(t)$, $R'_{n-1}(t), \ldots, R'_1(t)$ of the other bands, and outputs the combined audio signals $L'_n(t)$ and $R'_n(t)$ of all the bands to outside the decoding device 151.

Figure 24:
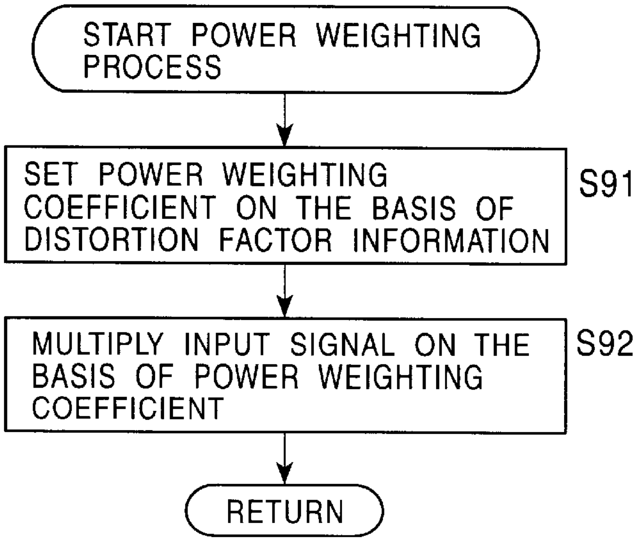
FIG. 24 is a flowchart illustrating the details of a process performed in step S74 of FIG. 23.

Next, referring to the flowchart in FIG. 24, the power weighting process performed in step S74 of FIG. 23 will be described.

In step S91, the power weighting coefficient setting section 171 sets the power weighting coefficients c and d of the multipliers 172-1 and 172-2 on the basis of the power weighting coefficient contained in the power correction information $P_{n,adj}(t)$ supplied from the decoding section 162.

In step S92, the multipliers 172-1 and 172-2 multiply the input signals $L'_n(t)_{mix}$ and $R'_n(t)_{mix}$ by the power weighting coefficients c and d, respectively, and outputs the generated signals $L'_n(t)$ and $R'_n(t)$ to the filter banks 165-1 and 165-2, respectively.

For example, as described above, in a case where the power correction information $P_{n,adj}(t)$ (power weighting coefficients) is set as c=1.25 and d=0.05 in the power correction section 123, and the respective power weighting coefficients c and d are set by the power weighting coefficient setting section 171, the multiplier 172-1 multiplies the power of the input signal $L'_n(t)_{mix}$ by 1.25, and outputs the generated signal L'n(t) to the filter bank 165-1. Also, the multiplier 172-2 multiplies the power of the input signal $R'_n(t)_{mix}$ by 0.05, and outputs the generated signal R'n(t) to the filter bank 165-2.

As a result, even when the separation of the left and right signals become poorer by coding, it is possible to reproduce a pseudo-stereo signal.

Although the above-described series of processes can be performed by hardware, it can also be performed by software. In this case, for example, the coding device 91 is formed of a personal computer 181 such as that shown in FIG. 25.

Figure 25:
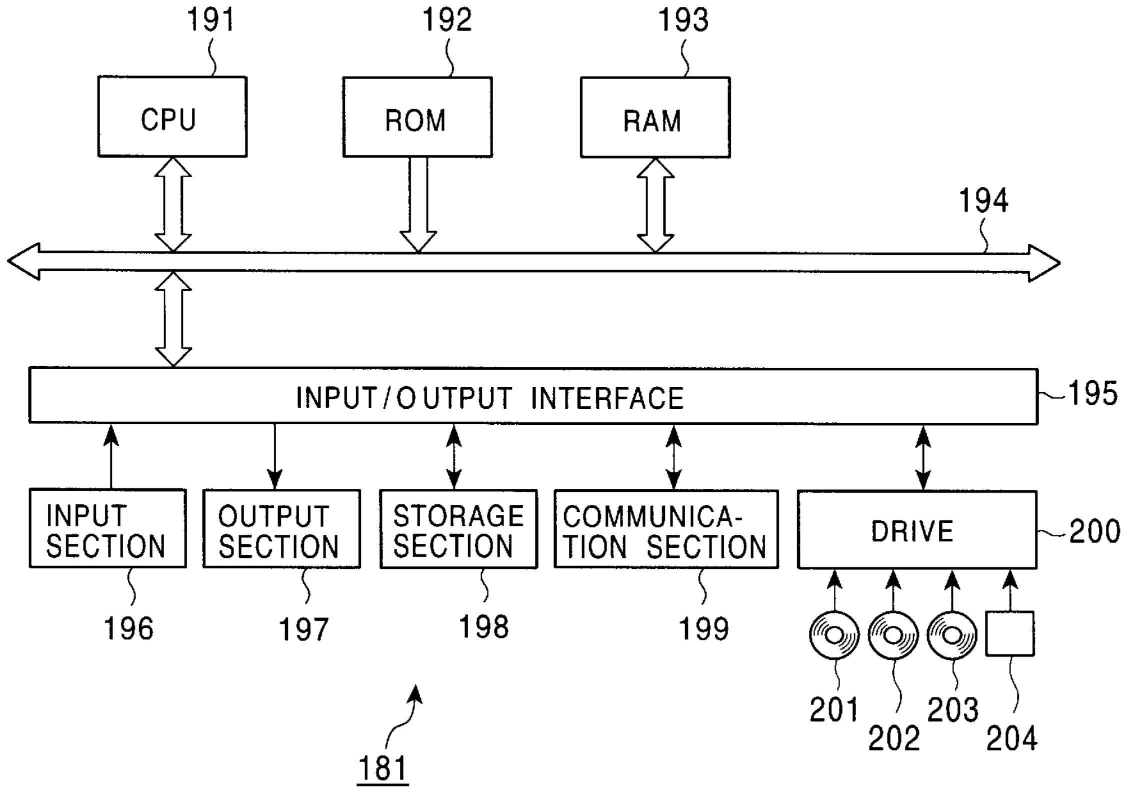
FIG. 25 is a block diagram showing an example of the configuration of a personal computer.

In FIG. 25, a CPU (Central Processing Unit) 191 performs various processing in accordance with a program stored in a ROM (Read Only Memory) 192 or a program loaded into a RAM (Random Access Memory) 193 from a storage section 198. Also, in the RAM 193, data, etc., required when the CPU 191 performs various processing is stored as appropriate.

The CPU 191, the ROM 192, and the RAM 193 are interconnected with each other via a bus 194. An input/output interface 195 is also connected to this bus 194.

An input section 196 including a keyboard, a mouse, etc., an output section 197 including a display formed of a CRT or an LCD (Liquid-Crystal Display), a speaker, etc., a storage section 198 formed of a hard disk, etc., and a communication section 199 formed of a modem, a terminal adapter, etc., are connected to the input/output interface 195. The communication section 199 performs a communication process via a network.

A drive 200 is also connected to the input/output interface 195 as necessary. A magnetic disk 201, an optical disk 202, a magneto-optical disk 203, a semiconductor memory 204, etc., is loaded into the drive 200 where appropriate, and a computer program read therefrom is installed into the storage section 198 as necessary.

In a case where a series of processes is performed by software, programs which form the software are installed from a network or a recording medium into a computer incorporated into dedicated hardware or into, for example, a general-purpose personal computer 181, etc., capable of executing various types of functions by installing various programs.

This recording medium, as shown in FIG. 25, is constructed by not only package media formed of the magnetic disk 201 (including a floppy disk), the optical disk 202 (including a CD-ROM, and a DVD (Digital Versatile Disk)), the magneto-optical disk 203 (including an MD (Mini-Disk)), or the semiconductor memory 204, in which programs are recorded, which is distributed separately from the main unit of the device so as to distribute programs to a user, but also is constructed by the ROM 192, a hard disk contained in the storage section 198, etc., in which programs are recorded, which is distributed to a user in a state in which it is incorporated in advance into the main unit of the device.

In this specification, steps which describe a program recorded in a recording medium contain not only processing performed in a time-series manner along the described sequence, but also processing performed in parallel or individually although the processing is not necessarily performed in a time-series manner.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A coding device for coding an input signal, comprising:

coding method selection means for selecting a coding method in accordance with the input signal;

coding means for coding said input signal in accordance with said coding method selected by said coding method selection means;

distortion factor detection means for detecting a distortion factor of coding by said coding means; and mixing means for mixing left and right components of said input signal on the basis of a mixing ratio determined in such a manner as to correspond to said distortion factor detected by said distortion factor detection means, wherein said coding method selection means selects said coding method in accordance with said input signal mixed by said mixing means.

2. A coding device according to claim 1, further comprising output correction information creation means for creating output correction information which is used when said input signal coded by said coding means is decoded.

3. A coding device according to claim 1, wherein said coding method selection means selects said coding method for use with said input signal on the basis of a threshold value determined according to the construction of said coding device.

4. A coding device for coding an input signal, comprising:

coding method selection means for selecting a coding method in accordance with the input signal;

coding means for coding said input sianal in accordance with said coding method selected by said coding method selection means;

distortion factor detection means for detecting a distortion factor of coding by said coding means; and mixing means for mixing left and right components of said input signal on the basis of a mixing ratio determined in such a manner as to correspond to said distortion factor detected by said distortion factor detection means, wherein, said coding method selection means selects said coding method in accordance with said input signal mixed by said mixing means, and said coding method said coding method selection means selects said coding method from among a dual coding method, an intermediate portion/side portion stereo coding method, and an intensity stereo coding method.

5. A coding device according to claim 4, wherein said coding method selection means selects said dual coding method when the correlation of the left and right components of said input signal is low.

6. A coding device according to claim 5, wherein said coding method selection means determines the correlation of the left and right components of said input signal by using the ratio of the total sum of the sum signals with respect to the total sum of difference signals of said left and right components.

7. A coding device according to claim 5, wherein, when the correlation of the left and right components of said input signal is high, said coding method selection means determines which one of the MS stereo coding and the IS stereo coding should be selected on the basis of a maximum value of the difference signal of said left and right components.

8. A coding device for coding an input signal, comprising:

coding method selection means for selecting a coding method in accordance with the input signal;

coding means for coding said input signal in accordance with said coding method selected by said coding method selection means;

distortion factor detection means for detecting a distortion factor of coding by said coding means; and mixing means for mixing left and right components of said input signal on the basis of a mixing ratio determined in such a manner as to correspond to said distortion factor detected by said distortion factor detection means, wherein, said coding method selection means selects said coding method in accordance with said input signal mixed by said mixing means, and said mixing means stores said mixing ratio, and changes said mixing ratio on the basis of an interpolation function of said mixing ratio determined immediately before and said mixing ratio determined currently.

9. A coding device according to claim 1, further comprising input signal storage means for storing said input signal, wherein said mixing means mixes the left and right components of the particular input signal stored in said input signal storage means at least once on the basis of the mixing ratio determined in such a manner as to correspond to the distortion factor when the particular input signal was coded.

10. A coding method for coding an input signal, comprising:

a coding method selection step of selecting a coding method in accordance with the input signal;

a coding step of coding said input signal in accordance with said coding method selected in said coding method selection step;

a distortion factor detection step of detecting a distortion factor of coding in said coding step; and a mixing step of mixing the left and right components of said input signal on the basis of a mixing ratio determined in such a manner as to correspond to said distortion factor detected in said distortion factor detection step, wherein the process of said coding method selection step selects said coding method in accordance with said input signal mixed in said mixing step.

11. A recording medium having recorded thereon a computer-readable program, said program comprising:

a coding method selection step of selecting a coding method in accordance with an input signal;

a coding step of coding said input signal in accordance with said coding method selected in said coding method selection step;

a distortion factor detection step of detecting a distortion factor of coding in said coding step; and a mixing step of mixing the left and right components of said input signal on the basis of a mixing ratio determined in such a manner as to correspond to said distortion factor detected in said distortion factor detection step, wherein the process of said coding method selection step selects said coding method in accordance with said input signal mixed in said mixing step.

12. A decoding device for decoding a code sequence coded by a predetermined coding method, said decoding device comprising:

decoding method selection means for selecting a decoding method corresponding to said coding method;

decoding means for decoding an input code sequence in accordance with said decoding method selected by said decoding method selection means;

correction means for correcting the left and right components of a signal decoded by said decoding means on the basis of information supplied from said coding device; and output means for outputting said signal corrected by said correction means.

13. A decoding method for decoding a code sequence coded by a predetermined coding method, said decoding method comprising:

a decoding method selection step of selecting a decoding method corresponding to a coding method used by a coding device;

a decoding step of decoding an input code sequence in accordance with said decoding method selected in said decoding method selection step;

a correction step of correcting the left and right components of a signal decoded in said decoding step on the basis of information supplied from said coding device; and an output step of outputting said signal corrected in said correction step.

14. A recording medium having recorded thereon a computer-readable program, said program comprising:

a decoding method selection step of selecting a decoding method corresponding to a coding method used by a coding device;

a decoding step of decoding an input code sequence in accordance with said decoding method selected in said decoding method selection step;

a correction step of correcting the left and right components of a signal decoded in said decoding step on the basis of information supplied from said coding device; and an output step of outputting said signal corrected in said correction step.

* * * * *